US005087815A

United States Patent [19]

Schultz et al.

[11] Patent Number: 5,087,815

[45] Date of Patent: Feb. 11, 1992

[54] HIGH RESOLUTION MASS SPECTROMETRY OF RECOILED IONS FOR ISOTOPIC AND TRACE ELEMENTAL ANALYSIS

[76] Inventors: J. Albert Schultz, 2427 Bolsover; Howard K. Schmidt, 1714 Albans, both of Houston, Tex. 77005

[21] Appl. No.: 559,731

[22] Filed: Jul. 30, 1990

Related U.S. Application Data

[63] Continuation-in-part of Ser. No. 433,482, Aug. 11, 1989, abandoned.

[51] Int. Cl.[5] .............................................. H01J 37/08

[52] U.S. Cl. .................................... 250/309; 250/287; 250/307

[58] Field of Search ............... 250/309, 307, 281, 282, 250/287, 283, 441.1, 440.1

[56] References Cited

U.S. PATENT DOCUMENTS

| | | | |
|---|---|---|---|
| 3,480,774 | 11/1969 | Smith | 250/309 |
| 3,576,992 | 5/1971 | Moorman et al. | |
| 3,863,068 | 1/1975 | Poschenrieder | 250/287 |
| 3,898,115 | 6/1975 | Tamura et al. | 250/309 |
| 4,020,353 | 4/1977 | Saito et al. | 250/441.1 |
| 4,036,167 | 7/1977 | Lu | 118/7 |
| 4,037,100 | 7/1977 | Purser | 250/281 |
| 4,166,784 | 9/1979 | Chapin et al. | 204/192 R |
| 4,172,020 | 10/1979 | Tisone et al. | 204/192 R |
| 4,331,702 | 5/1982 | Hieber et al. | 427/10 |
| 4,367,044 | 1/1983 | Booth et al. | 356/357 |
| 4,381,894 | 5/1983 | Gogol et al. | 356/72 |
| 4,393,311 | 7/1983 | Feldman et al. | 250/459.1 |
| 4,394,237 | 7/1983 | Donnelly et al. | 204/192 E |
| 4,405,989 | 9/1983 | Tsukada et al. | 364/525 |
| 4,430,151 | 2/1984 | Tsukada | 156/626 |
| 4,478,993 | 10/1988 | Waugh et al. | 250/287 |
| 4,489,237 | 12/1984 | Litherland et al. | 250/287 |
| 4,493,745 | 1/1985 | Chen et al. | 156/626 |
| 4,569,592 | 11/1982 | Osada et al. | 356/318 |
| 4,596,928 | 6/1986 | Dantillos | 250/307 |
| 4,607,167 | 8/1986 | Petric | 250/441.1 |
| 4,637,938 | 1/1987 | Lee et al. | 427/53.1 |
| 4,670,651 | 6/1987 | Meier et al. | 250/309 |
| 4,713,140 | 12/1987 | Tien | 156/626 |
| 4,818,838 | 4/1989 | Young et al. | 250/441.1 |
| 4,857,136 | 8/1989 | Zajac | 156/626 |
| 4,864,130 | 9/1989 | Gruen et al. | 250/305 |

OTHER PUBLICATIONS

Y. S. Chen et al., Energy and Mass Spectra of Neutral and Charged Particles Scattered and Desorbed from Gold Surfaces, Surface Science 62:133–147 (1977).

(List continued on next page.)

*Primary Examiner*—Bruce C. Anderson
*Attorney, Agent, or Firm*—Fulbright & Jaworski

[57] ABSTRACT

Disclosed is a method and apparatus for the measuring of isotopic ratio determination of elements on metallic, semi-conducting or insulating surface. The method involves pulsing an ion beam of at least about 2 KeV at a grazing incidence to impinge upon the surface of the sample. The ions which are recoiled off the surface of the sample are detected with a high resolution time-of-flight mass spectrometer which is comprised of at least one linear field free drift tube and at least one toroidal or spherical energy filter with a +/−V polarization to detect positive or negative ions. The method is applicable to a wide variety of elements from the periodic table and the ion source can be selected from a wide variety of ions which can be bombarding onto a sample. There are further methods for measuring of the ions under high pressure mass spectrometry, at pressures as high as 1 Torr. The apparatus can be adapted for the quantitation measurement of the elements on the surface under the high pressure conditions. Also disclosed is an apparatus for measuring ions. This apparatus can contain anywhere from 1 to 5 mass analyzers including measurements for recoiled and direct recoiled ions, for ion scattering spectroscopy, for secondary ion spectroscopy and for detecting backscattered ions. Mass analyzers are positioned at appropriate angles to detect the ions released from the bombardment of the sample. When measuring the backscattering ions, the apparatus is set up for two separate sources.

47 Claims, 22 Drawing Sheets

OTHER PUBLICATIONS

Luitjens, S. B., The Measurement of Energy Spectra of Neutral Particles in Low Energy Ion Scattering, Appl. Phys. 21, 205–215 (1980).

Steffens, P., A Time-of-Flight Mass Spectrometer for Static SIMS applications, J. Vac. Sci. Technol. A:3(3), May/Jun. 1985.

Schultz, J. Albert, et al, Dectection of Surface Atoms by Energy Analysis of Scattered Primaries and Recoiled Secondaries from CsBr Under $Ar^+$ and $Ar^{2+}$ Bombardment, Chemical Physics Letters, vol. 100, Number 3, Sep. 9, 1983.

Becker, C. H., et al, Surface Analysis of Contaminated GaAs: Comparison of New Laser-Based Techniques with SIMS, J. Vac. Sci. Technol. A:3, No. 3, May, Jun. 1985.

Young, C. E., et al, Laser-Based Secondary Neutral Mass Spectroscopy: Useful Yield and Sensitivity, Nuclear Instruments and Methods in Physics Research, B27:119–129 (1987).

Willerding, B., et al, Time-of-Flight Measurements of Light Molecular Ions Scattered at Grazing Incidence from a Ni(111) Surface, Nuclear Instruments and Methods in Physics Research, B2:453–456 (1984).

Schultz, J. Albert, et al, Matrix Dependence of Secondary Ion Intensities From $Mg(OH)_2$ by Simultaneous Time-of-Flight SIMS and Direct Recoil Analysis, Solid State Communications, 55:11:957–960 (1985).

Aono, M., et al, Low-Energy Ion Scattering From The Si(001) Surface, Physical Review Letters, 49:8:567–560 (Aug. 23, 1982).

Niehus, H., et al, Ion Scattering Spectroscopy in the Impact Collison Mode (ISISS): Surface Structure Information from Nobel Gas and Alkali-Ion Scattering, Nuclear Instruments and Methods in Physics Research, B15:122–125 (1986).

Sakurai, T., et al, Ion Optics for Time-of-Flight Mass Spectrometers with Multiple Symmetry, International Journal of Mass Spectrometry and Ion Processes, 63:273–287 (1985), Small Bus. Inn.

Ionwerks, Appendix B., U.S. Department of Energy, Phase 1-FY 1988-1, Project Summary.

Ionwerks, DOE and Major Contractor Recommendations for Announcement and Distribution of Documents, U.S. Department of Energy (1989).

Eckstein, W., Direct Recoil Sputtering and Secondary Ion Production, Nuclear Instruments and Methods in Physics Research, B:27, 78–93 (1987).

Jo, Y. S., et al, Scattering of $CO^+$ from Magnesium Surfaces: Molecular Ion Survival and Scattered Positive and Negative Ion Fractions, J. of Physical Science (Reprint) 89:2113 (1985).

Bottiger, J., A Review on Depth Profiling of Hydrogen and Helium Isotopes within the Near-Surface Region of Solids by Use of Ion Beams, Journal of Nuclear Materials 78:161–181 (1978).

Cox, T. I., et al., An in situ study of the Reactive Ion Beam Etching of Tungsten with Tetrafluoromethan/argon Mixtures Using Ion Scattering Spectroscopy and Secondary Ion Mass Spectrometry, J. of Vacuum Science and Technology, A8:1685–1689 (1990).

M. Aono et al, A Novel Method for Real-Time Structural Monitoring of Molecular Beam Epitaxy (MBE) Processes, Proceedings of the Japanese Academy, 65:137–141, 1989.

Campana, J. E., et al., Ion/Molecule Reactions of Sputtered Species, Int'l. J. of Mass Spectrometry and Ion Processes 78:195–211 (1987).

Callahan, J. H., et al, High-Pressure Fast-Atom Bombardment Mass Spectrometry: Collisional Stabilization and Reactions of Alkali Halide Cluster Ions, Int'l. J. of Mass Spectrometry and Ion Processes 90:9–38 (1989).

Sitter, J. A., et al, Ultrahigh Vacuum Apparatus For Combined Low-Energy Electron Diffraction, Auger-Spectroscopy, MeV Ion Scattering, and Nuclear Microanalysis, Review of Scientific Instruments, 53:797–802 (1982).

Macarthur, J. D., et al, Materials Analysis With An External Beam Proton Microprobe, Nuclear Instruments and Methods, 191:204–210 (1981).

Blom, Karl, et al, High-Pressure Collisional Activation Mass Spectrometry, J. of the American Chemical Society 105:3793–3799 (1983).

Koeleman, BJJ., et al, Adsorption Study of Hydrogen on a Stepped Pt(997) Surface Using Low Energy Recoil Scattering, Nuclear Instruments and Methods in Physics Research, 218:225–229 (1983).

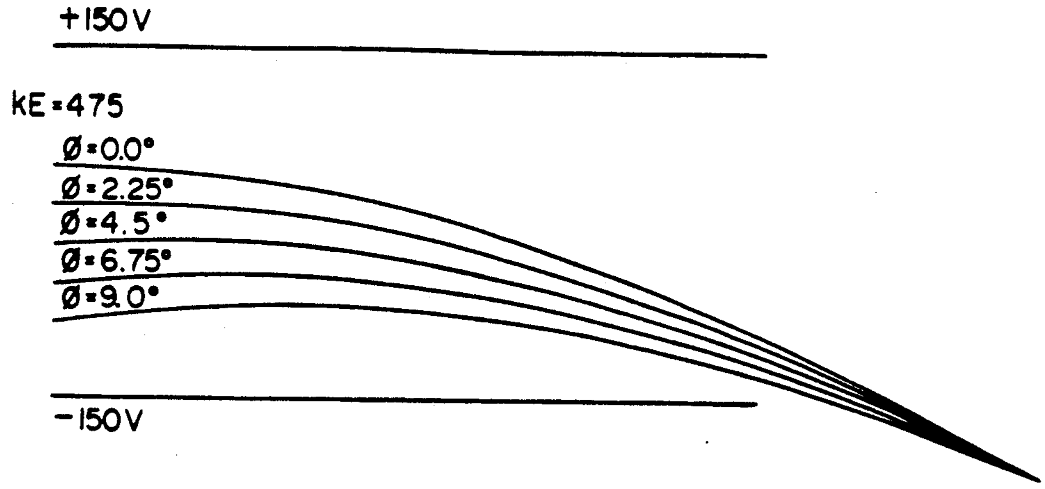
FIG. 10A
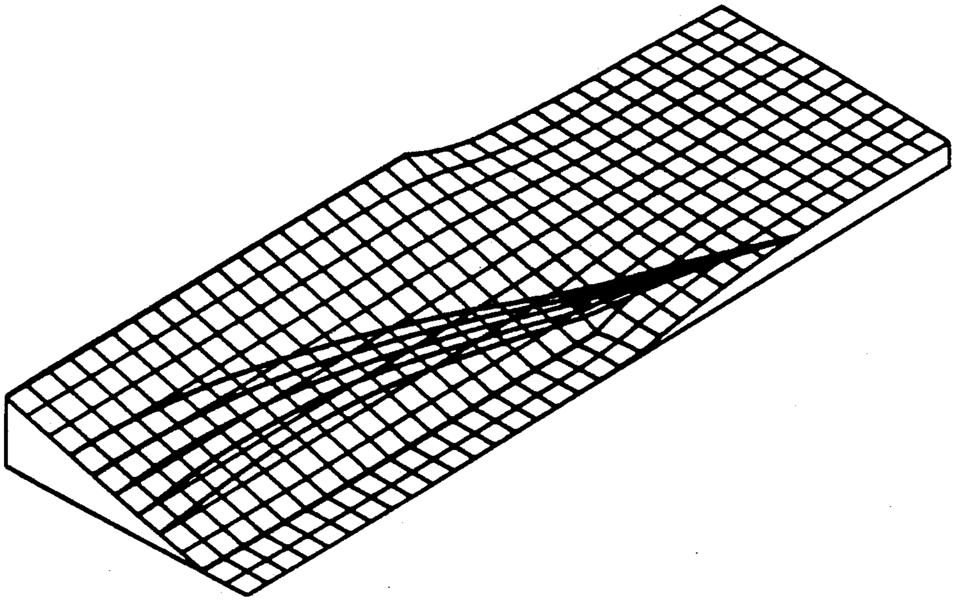
FIG. 10B
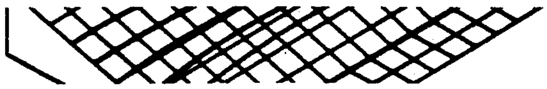

HIGH RESOLUTION MASS SPECTROMETRY OF RECOILED IONS FOR ISOTOPIC AND TRACE ELEMENTAL ANALYSIS

CROSS REFERENCE TO RELATED APPLICATION

This Application is a continuation-in-part of Applicant's co-pending Application Ser. No. 433,482 filed Nov. 8, 1989 now abandoned.

FIELD OF THE INVENTION

The present invention relates generally to mass spectrometers for isotopic ratio determination, for measuring surface elements with and without contamination and for analysis in a high-pressure environment using time-of-flight instrumentation. The mass spectrometer measures both recoiled and direct recoiled ions. The invention also relates to the use of multiple time-of-flight mass spectrometers for simultaneously measuring and quantifying elements on the surface, for isotopic ratio determination, for secondary ion mass spectometry and for backscatter ion determination. The invention also relates to methods for measuring isotopic ratio determination, surface element measurements and quantitation using time-of-flight measurements and bombardment with a pulsed ion beam.

BACKGROUND OF THE INVENTION

While secondary ion mass spectometry (SIMS) (particularly time-of-flight (TOF)/SIMS) is emerging as a powerful surface analytical tool, an inherent drawback for isotope identification results from isobaric interferences. Ubiquitous hydrocarbon signals, particularly from samples extracted from a biological milieu, provide signal at virtually every mass and make interpretation difficult. One does not know if the secondary ion intensity is from isotope or from hydrocarbon.

There are several other techniques being developed for measurement of isotopic abundances on surfaces. One is accelerator mass spectrometry. This technique avoids the complicated mass spectra associated with SIMS where a signal is seen at all masses from hydrocarbon fragments. Accelerator mass spectrometry strips the electrons from all molecular secondary ions resulting in their total fragmentation. Unfortunately accelerator mass spectrometry requires a fairly expensive and cumbersome apparatus.

Alternatives to accelerator mass spectrometry are laser based techniques for elemental identification. These experiments require vaporization of a solid material by either ion bombardment or laser ablation with subsequent photoionization of the vapor and mass analysis of the resulting elemental ions. The differences in the laser techniques for the vapor analysis depend upon the method of ionization, and upon the type of mass spectroscopy used. In one technique, a pulsed (10 Hz) high powered excimer laser is directed into the sputtered material. All atoms and molecules are ionized to some extent and mass analyzed by TOF. Although this approach ionizes the sputtered neutrals, its limitation with respect to isotope identification is identical to SIMS, for example, isobaric interferences.

A laser technique for specific elemental detection to circumvent isobaric interferences involves tuning a dye laser frequency until one or a multiple photon resonance with an electronic state of the desired element occurs. The photon absorption cross section, as resonance is approached, increases by orders of magnitude and subsequent photons can ionize all of the element in the laser focal volume (100% efficiency). Resonance ionization has been used to sensitively analyze for ppb levels of iron in silicon. While this is an elegant technique, one has several problems in applying this in a routine fashion. For one thing the apparatus is very complex and combines most of the hard experimental problems to be found in both surface science as well as laser physics. Another more subtle problem is that if a significant fraction of the element of interest is sputtered in molecular form, then it is invisible to the resonance technique. This can be a serious limitation. For example, during uranium (U) analyses in urine, as the ablation of the sample progresses, U changes oxidation state and is sputtered as $UO_2$ instead of U. The resonance signal for U vanishes although uranium is still in the sample. An inherent limitation of the resonance ionization technique for isotopes is that the laser frequency must be changed to match each isotope of interest.

A criticism of TOF mass spectrometry is that in order to obtain high transmission and simultaneous identification of masses one sacrifices data throughput. If a narrow mass region is of interest, then the low duty cycle of TOF wastes a lot of time compared to a quadrupole or a magnetic sector instrument. The purging technique suggested in the present invention would seem to be particularly suitable as a way of eliminating this criticism. It will also be possible to perform this in other applications of doubly symmetric TOF systems such as TOF/SIMS.

All of our information about in-situ process chemistry has come from the gas phase (reactants), mostly using infrared spectroscopy. Previously, no method for observing reaction chemistry at the surface (products) was available. This is understandable, since surface science is difficult even under the best ultra high vacuum (UHV) conditions, and the electron-based surface spectroscopies (e.g. XPS, AES, UPS, HREELS) would be subject to scatter and attenuation by process gas. If implemented, the first three of these would be of little value because they are completely insensitive to hydrogen and isotopic variations, while the notoriously difficult HREELS is very slow, strictly qualitative and would be severely compromised b inelastic electron scattering by the gas ambient.

Typical conditions for diamond growth include a hydrogen:1% methane gas feed at 1 to 100 Torr, a substrate heated to about 950° C., and "activation" by an incandescent filament or electric discharge. Generally accepted features of low pressure diamond process chemistry are that atomic hydrogen must be present, along with a small carbon bearing growth species. Methyl radical and acetylene appear from gas phase diagnostics to be the only growth candidates sufficiently abundant to account for observed growth rates. Speculations about the role of atomic hydrogen include (1) formation of methyl radical by abstraction, (2) suppressing formation of poly-aromatic hydrocarbons in the gas phase, and (3) etching graphitic deposits from the growth surface.

The critical role of the surface has largely been ignored theoretically, due to the lack of hard experimental data on it. The native surface of diamond is hydrogen terminated, and although UHV surface studies have shown diamond to desorb hydrogen and reconstruct at the usual growth temperatures, an implicit assumption in existing mechanistic theories is that diamond is fully hydrogen saturated under growth conditions. The degree of hydrogenation of the surface under process conditions has a large impact on growth mechanism theory, as the chemistry of saturated hydrocarbons and olefins are completely different. In keeping with this, atomic hydrogen has been assumed to activate the surface by H abstraction. Surface radical sites can reasonably react with either methyl radical (by recombination) or with acetylene (by polymerization). The subsequently required steps of cyclyzing pendant alkyl groups to extend the diamond lattice, and removing their excess hydrogen have also been ignored.

To solve the need for an efficient and inexpensive method, mass spectrometry of recoiled ions (MSRI) was developed into a general surface analysis technique. This method is complementary and in some ways superior to existing techniques for surface isotope and impurity analysis. MSRI should have a future in semiconductor analysis and in biomedical studies in which non-radioactive isotopic tracer analysis or trace elemental detection is desired.

The current understanding of the chemical mechanisms involved in low pressure chemical vapor deposition (LPCVD) of diamond is poor at best. In general, to characterize a chemical system, one needs information about both the reactants and the products. The present invention, high pressure direct recoil spectroscopy (DRS), solves these problems.

The inventors recognized that the energetic, massive particles used in ion beam analysis techniques would be relatively insensitive to gas phase attenuation. Thus, they developed DRS to observe the growing diamond surface in-situ, and resolve the above mechanistic issues.

SUMMARY OF THE INVENTION

An object of the present invention is a method for isotopic ratio determination on a surface.

An additional object of the present invention is detection of a variety of elements from the periodic table.

A further object of the present invention is the use of an ion beam of at least about 2 KeV to detect isotopic ratios on a surface of elements.

Further, an additional object of the present invention is a method of determining the elements on a surface with high pressure mass spectrometry.

Another object of the present invention is a device and method for measuring the surface during etching or deposition of the surface.

An additional object of the present invention is a method for the quantitative measurement of elements on the surface with a high pressure mass spectrometer.

A further object of the present invention is a method for process control during surface modification.

An additional object of the present invention is a mass spectrometer which simultaneously detects multiply recoiled and direct recoiled ions and neutrals, secondary ions, and back and forward scattered ions and neutrals.

A further object of the present invention is a method of determining crystallography by blocking and shadowing analysis.

Thus in accomplishing the foregoing objects, there is provided in accordance with one aspect of the present invention a method for isotopic ratio determination of elements on a metallic, semi-conducting or insulating surface comprising the steps of: pulsing an ion beam of at least about 2 KeV at grazing incidence between 45° and 80° measured relative to the surface normal to impinge said surface; and detecting the ionized elements directly recoiled from the surface with a high resolution time-of-flight mass spectrometer comprised of at least one linear field free drift tube and at least one toroidal or spherical energy filter with a +/− V polarization to deflect positive or negative ions. In the preferred embodiment, the ion beam is selected from the group of elements consisting of Cs, Na, Li, B, He, Ar, Ga, In, Kr, Xe, K, Rb, $O_2$, $N_2$ and Ne. In a more preferred embodiment, the ion beam is Cs and the ion beam is at least about 15 KeV. In another preferred embodiment, the surface which is being detected is coated with an overlayer and the overlayer is usually selected from the group consisting of hydrocarbons, gold, platinum, aluminum, oxides, frozen noble and molecular gases.

Another embodiment of the invention includes a method for determining the elements on a surface with high pressure mass spectrometry comprising the steps of: pulsing an ion beam of at least about 2 KeV at grazing incidence of between 45° and 80° to impinge said surface; and detecting the direct recoiled ions with a mass spectrometer having a time-of-flight sector located at an elevation angle of about 0° to 85° measured relative to the surface and in the forward direction and a channelplate detector for measurement of direct recoiled ions. In a preferred embodiment, the angle is 35° and the pressure is from about $10^{-11}$ Torr to 1 Torr.

A further embodiment of the present invention is a method for quantitative measurement of elements on a surface with a high pressure mass spectrometer comprising the steps of: pulsing an ion beam of at least about 2 KeV at grazing incidence of between 45° and 80° to impinge the surface; detecting positive or negative ions of elements recoiled from the surface with a first high resolution time-of-flight mass analyzer comprised of at least one linear field free drift tube and at least one toroidal or spherical energy filter with a +/− V polarization on the sectors of the filter to deflect positive and negative ions, wherein the outer sector of said filter contains a hole; detecting direct recoiled ions and neutrals with a second mass analyzer attached to the first mass analyzer and positioned to detect ions and neutrals exiting through said hole, wherein said second mass analyzer has a time-of-flight detector located at an elevation angle of 0° to 85° and in the forward direction, an el deflection plate to separate negative and positive ions and neutrals, and a channelplate detector with at least three anodes, said anodes detecting either direct recoiled negative or positive ions or neutrals; and, alternately collecting data on the first and second mass analyzers at time intervals of 10 μsec. to 1 sec. and comparing the neutrals and ions detected to obtain the ion fraction of the recoiled element.

In an alternative embodiment, a computer system is used for regulating the frequency of pulsing and the collection of data from the first and second analyzers.

In another preferred embodiment, a pulse sequencer can be attached to the first mass analyzer within at least one linear field free flight path.

A further embodiment of the present invention is an apparatus for measuring recoiled and direct recoiled ions comprising a sample chamber; an ion beam pulsing means for generating a pulsed ion beam, said pulsing means oriented at an angle to the sample chamber, wherein the pulsing ion beam impinges a surface of a sample in the sample chamber at a grazing incidence of about 45° to 80°; a first mass analyzer attached to the sample chamber at an elevation angle of about 0° to 85° relative to the sample surface and in the forward specular direction, said first analyzer having at least one field free drift tube and at least one toroidal or spherical energy filter with sector halves polarizable +/− V for the deflection of positive or negative ions and, wherein the outer sector of said filter includes a hole; a second mass analyzer for detecting direct recoiled ions and neutrals said second analyzer having an ion detector attached to at least one field free drift tube of said first analyzer in a position to detect ions and neutrals exiting through the hole in the outer sector of the first analyzer when the sector halves are both grounded; and a computer system for regulating the frequency of pulsing and collection of data from the first and second analyzers. In one preferred embodiment, the apparatus comprises further at least one pulse sequencer attached to the first mass analyzer within at least one linear field free flight path. Additional embodiments to enhance the system include: an ion pulsing means including at least about a 15 KeV alkali ion source; at least one adjustable slit attached between the ion source and the sample chamber for directing and focusing the ion beam emitted from the ion source and at least one pulser and lens attached between the ion source and sample chamber for generating a pulsed ion beam.

In one preferred embodiment, the apparatus includes a focusing lens to vary the divergence between 0.5° to 3°, said lens attached between the pulser and the sample.

Another embodiment includes the apparatus with at least one additional mass analyzer for ion scattering spectroscopy, said mass analyzer having a time-of-flight tube with at least one channelplate detector attached to the sample chamber at a scattering angle of about 45° to 180°.

An additional embodiment of this apparatus is the addition of at least one channelplate ring detector and a second ion beam source and sector containing a hole in the outer sector half positioned between the detector and the sample for detecting backscatter ions, wherein direction of incidence of ion beam on the sample is normal to the mid point of the diameter of said at least one channelplate ring. In the preferred embodiment, the channelplate detector includes an annuli of 10 concentric metal ring collectors where each annular ring is ½° wide and said detector is positioned behind mounted dual channelplates to detect 10 backscattering spectra covering about 165° to 180°.

In another embodiment, there is a fourth mass analyzer for detecting secondary ions at an angle of about ±30° relative to the sample normal, said fourth analyzer having at least one field free drift tube and at least one toroidal or spherical energy filter with sector halves polarizable +/− V for deflection of positive or negative ions, wherein the outer sector of said filter includes a hole; and a fifth mass analyzer for detecting scattered ions and neutrals; said fifth analyzer having an ion detector attached to the at least one field free drift tube of the fourth analyzer in a position to detect ions and neutrals exiting through the hole in the outer sector of the fourth analyzer. This later embodiment can also have at least one pulse sequencer attached to the fourth mass analyzer within at least one linear field free flight path. In addition to this complete system of five analyzers, smaller systems including any combinations of the five analyzers can be added to form a system for detecting either ion scattering spectroscopy, secondary ion spectometry, direct and multiply recoiled ion spectroscopy and back scattering.

An additional embodiment is a device for high pressure real time stoichiometry measurements of a surface comprising: a sample chamber; an ion beam pulsing means oriented at an angle to the sample chamber generating a pulsed ion beam at a grazing incidence to impinge the surface of a sample in the sample chamber; a micro capillary gas doser to form a local area of high pressure on the surface; a first array of discrete detectors in the forward specular hemisphere to measure forward ion scatter from the ion beam impinging the surface, said first array including up to about 100 discrete detectors each defining a scattering angle of ±0.5°; a second array of discrete detectors in the back specular hemisphere to measure the backward ion scatter from the ion beam impinging the surface, said second array including up to about 100 discrete detectors each defining a scattering angle of ±0.5°; and a collection means to collect a multiplicity of time of flight data simultaneously from each detector in both the first and second array of discrete detectors.

Other embodiments of the above devices include replacing the gas doser with devices for depositing elements on the surface or devices for etching the surface. The chamber of the device can be differentially pumped.

A further embodiment is to use the devices to measure real time stoichiometry of the surface under various high pressure conditions which modify the surface being measured.

Other and further objects features and advantages will be apparent in the following description of present and preferred embodiments of the invention. Given for the purpose of disclosure and taken in conjunction with the accompanying drawings.

DESCRIPTION OF THE DRAWINGS

The invention will be more readily understood from a reading of the following specification by reference to accompanying drawings, forming a part thereof, where examples of embodiments of the invention are shown and wherein:

FIG. 10A–B shows the ion optic model for final deflector and chemical vapor deposition beam line. The line-of-sight view of the sample permits ellipsometry 10A is the optic model and 10B is the opthalmotograph for ellipsometry.

The drawings and figures are not necessarily to scale and certain features of the invention may be exaggerated in scale or shown in schematic form in the interest of clarity and conciseness.

DETAILED DESCRIPTION OF INVENTION

It will be readily apparent to one skilled in the art that various substitutions and modifications may be made to the invention disclosed herein without departing from the scope and the spirit of the invention.

Figure 1:
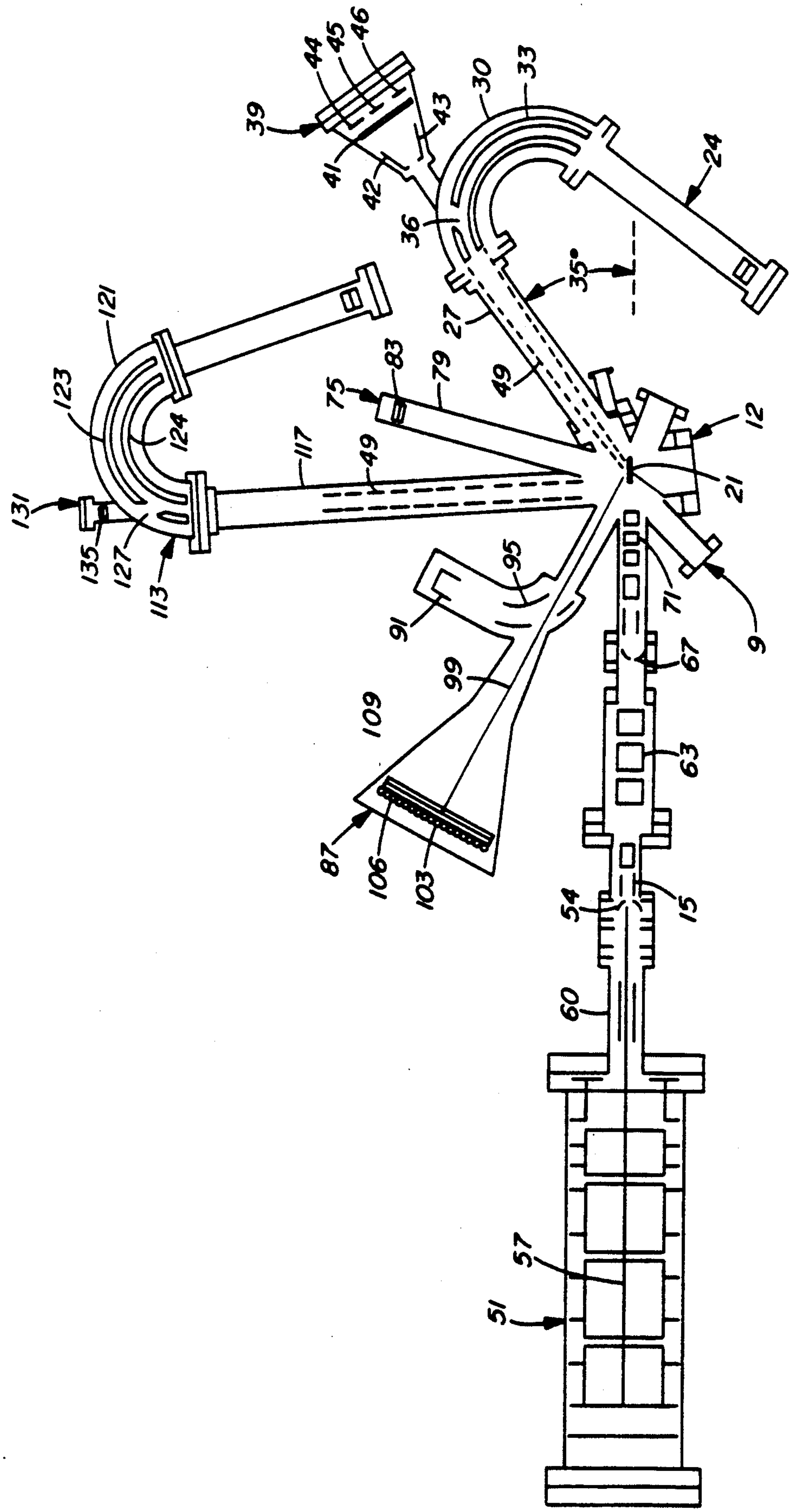
FIG. 1 is a schematic cross section of the sample chamber, mass analyzer and the scattering plane of the device of the present invention.
Figure 2:
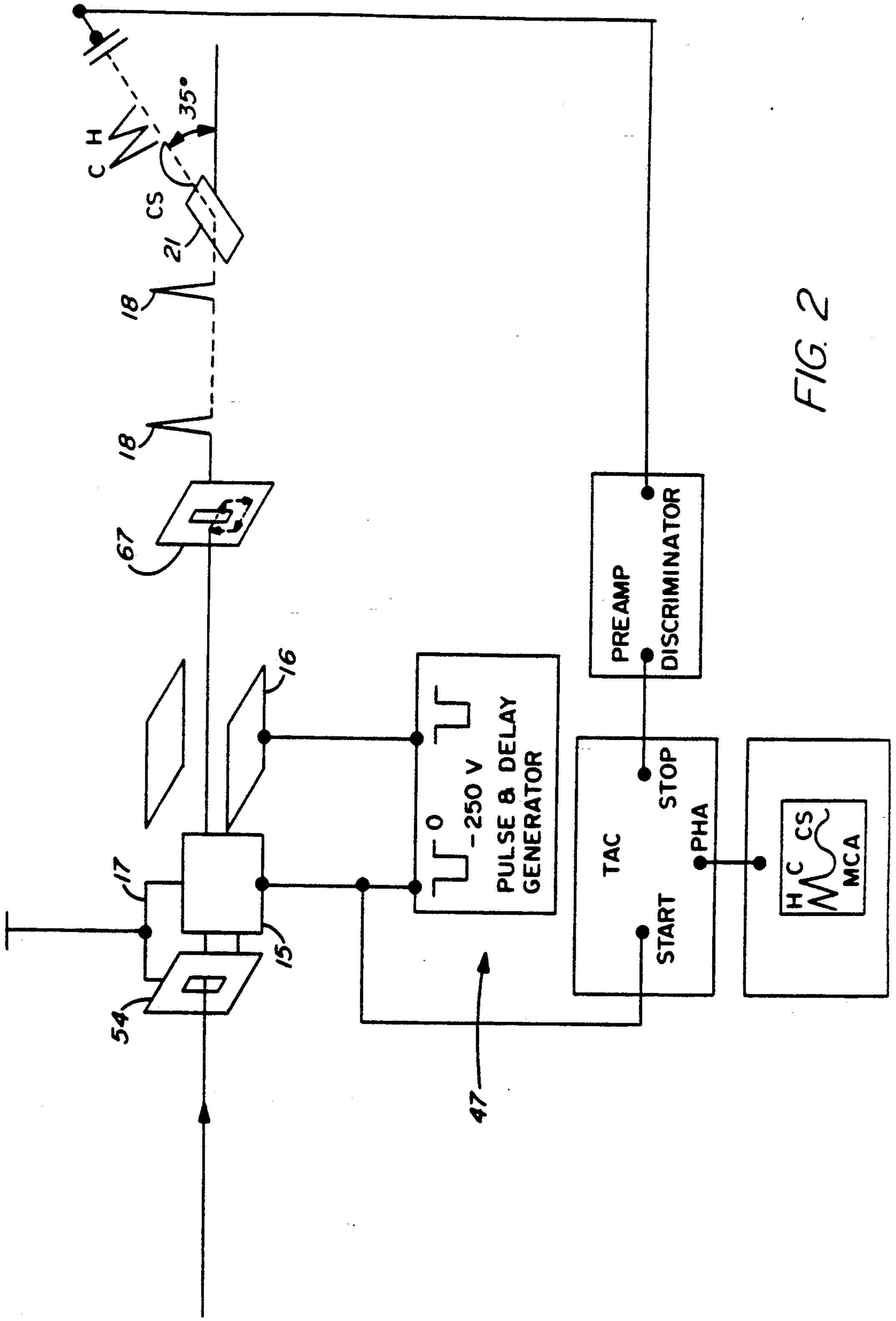
FIG. 2 is a block diagram of the ion pulse formation and timing electronics.

As seen in FIGS. 1 and 2 one embodiment of the present invention is an apparatus 9 for measuring multiply recoiled (indirect) and direct recoiled ions comprising a sample chamber 12, an ion beam pulsing means 15 for generating a pulsed ion beam 18, said ion beam pulsing means 15 oriented at an angle to the sample 21, wherein the pulsed ion beam 18 impinges a surface of a sample 21 in the sample chamber 12 at a grazing incidence of about 45° to 80°. A first mass analyzer 24 attached to the sample chamber 12 at an angle of about 0° to 85° relative to the sample 21 in the forward specular direction, said first analyzer 24 having at least one field free drift tube 27 and at least one toroidal or spherical energy filter 30 with sector halves polarizable +/− V for the deflection of positive or negative ions, wherein the outer sector half 33 of said filter 30 includes a hole 36, said hole 36 affording a line of sight to the spot where the pulsed ion beam 18 impinges the surface 21; a second mass analyzer 39 for detecting direct recoiled ions and neutrals exiting through said hole 36 when the sectors of the first analyzer 24 are grounded, said second analyzer 39 having an ion detector 41 attached to at least one field free drift tube 27 of said first analyzer 24 in a position to simultaneously detect positive and negative ions and neutrals separated by electrostatic deflector plates 42 and 43 and detected by three separate anodes 44, 45 and 46 positioned behind the ion detector after said ions and neutrals exit through the hole 36 in the outer sector 33 of the first analyzer 24; and a computer system 47 for regulating the frequency of pulsing and the collection of data from the first 24 and second 39 analyzers.

Figure 3:
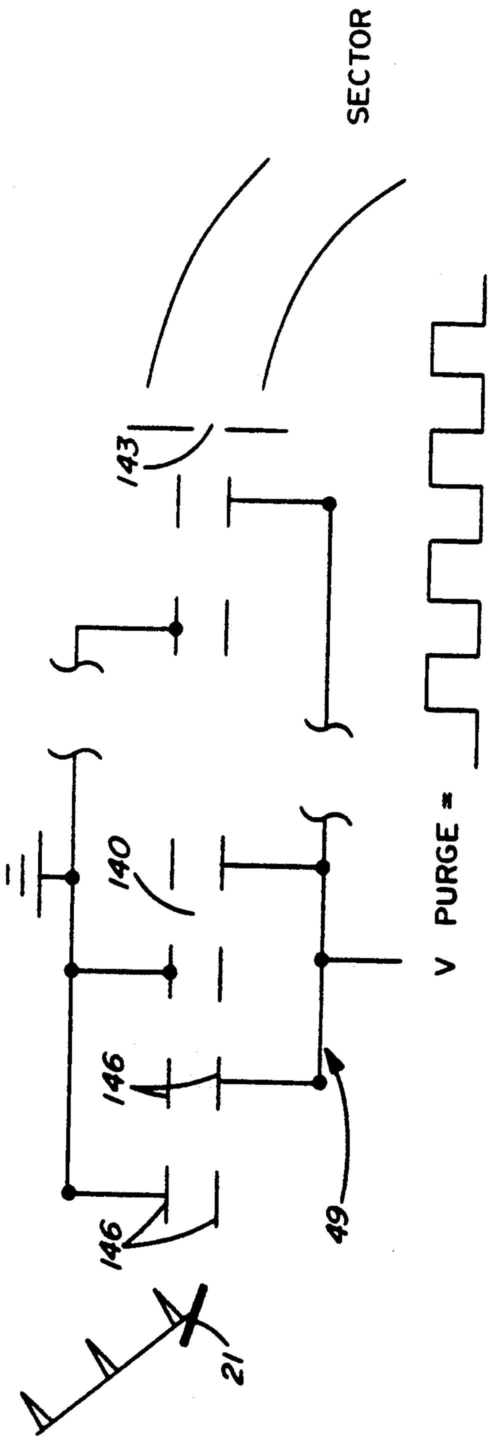
FIG. 3 is an example of a pulse sequencer showing the filling of the linear field free region between either a MSRI or a TOF/SIMS sector.

An enhancement to the system includes the attachment of at least one pulse sequencer 49, shown in FIG. 3, to the first mass analyzer 24 within at least one linear field free flight path 27.

In a preferred embodiment the ion pulsing means 15 includes at least about a 15 KeV alkali ion source 51, at least one adjustable slit 54 and a wien filter 60 attached between the ion source 51 and the sample chamber 12 for directing, focusing and mass selecting the ion beam 57 emitted from the ion source 51 and at least one pulser 15 and lens 63 and second adjustable slit 67 attached between the ion source 51 and sample chamber 12 for generating a pulsed ion beam 18. In another preferred embodiment the apparatus 9 further includes a focusing lens 71 to vary the divergence between 0.5° to 3° wherein the focusing lens 71 is attached between the pulser 15 and the sample 21. In a preferred embodiment the second mass analyzer sector 24 is at an angle of 35°.

A further enhancement to the above apparatus 9 can be seen in FIG. 1 where the apparatus 9 further comprises a third mass analyzer 75 for ion scattering spectroscopy (ISS), said third mass analyzer 75 having a time-of-flight tube 79 with at least one channelplate detector 83 attached to the sample chamber 12 at a scattering angle of about 45° to 180°. In the preferred embodiment this third mass analyzer 75 is at a scattering angle of 78°.

An additional enhancement of the apparatus 9 of FIG. 1 containing a first 24 and second 39 and a third 75 mass analyzer is the further inclusion of at least one channelplate ring detector 87 positioned between a second ion beam source 91 and sector 95 containing a hole in the outer sector half and the sample 21 for detecting backscatter ions, wherein direction of incidence of ion beam 99 on the sample 21 is normal to the midpoint of the diameter of said at least one anode ring 103. The channelplate detector 87 can include ten concentric annuli rings 106 wherein each annular ring 103 is at least a ½ degree wide and the annular anode rings 106 are positioned on a channelplate 109 to detect ten backscattering spectra covering an angle of about 165° to 180° angle.

To measure backscatter ions the source 91 is pulsed and the sector 95 is turned on so that the pulse hits the sample. The sector 95 is then turned off so that the backscattered ions make it through the hole 96. The arrival of the backscattered ions to each ring 103 is timed.

An additional embodiment of the apparatus 9 containing the first 24, second 39, and third 75 mass analyzer is the inclusion of a fourth mass analyzer 113 for detecting secondary ions at an angle of about ±30° relative to the sample normal, said fourth mass analyzer 113 having at least one field free drift tube 117 and at least one toroidal or spherical energy filter 121 with sector halves 123 and 124 polarizable +/− V for deflection of positive or negative ions, and which has a means for biasing either the sample 21 or the fourth mass analyzer 113 to extract secondary ions into the fourth analyzer 113, wherein the outer sector half 123 of said filter includes a hole 127; and a fifth mass analyzer 131 for detecting scattered ions and neutrals, said fifth mass analyzer 131 having an ion detector 135 attached to at least one field free drift tube 117 of the fourth mass analyzer 113 in a position to detect ions and neutrals exiting through the hole 127 in the outer sector half 123 of the fourth mass analyzer 113. In a preferred embodiment a pulse sequencer 49 is attached to at least one linear field free flight path of the fourth mass analyzer 113.

The embodiments using the fourth mass analyzer 113 and the fifth analyzer 135 are used for ion scattering spectroscopy (ISS) and secondary ion mass spectrometry (SIMS).

As can be seen from the figures, various combinations of the mass spectrometer analyzers can be put together for backscattering ion spectroscopy (BIS), direct recoils (DRS) secondary ion mass spectrometry (SIMS), ion scattering spectrometry (ISS). One skilled in the art readily recognizes that any combination of these can be made based on the configurations described in the present invention.

In either the first 15 or second 91 pulsing means the pulsing ion beam which is used can be selected from a variety of elements including any of Cs, Na, Li, B, He, Ar, Ga, In, Kr, Xe, K, Rb, $O_2$, $N_2$ and Ne. One skilled in the art will readily recognize that the element used for the pulsing ion beam will affect the choice of energy level of the beam. Further, the element selected will also depend on the elements to be detected.

At present, 15 KeV is the preferred energy level and Cs the preferred element for the pulsing ion beam; however other energy levels and ions also work. In choosing an ion beam source it is important to keep in mind that the recoil cross-section will go down as the beam energy is increased. This is compensated, however, by the increase in primary ion penetration depth through an overlayer and the increase in the energy of the subsequently recoiled atom. These latter two factors enhance the probability of formation and escape of the underlayer ion recoiled through the overlayer. In the second pulse source He, Li, Ne and Na are preferable.

The recoil signal intensity can be normalized to Primary ion current density to account for the effect of more efficient primary ion extraction from the source at higher beam energies.

Another improvement is to increase the convergence of the primary ion source at the target. The main reason to have a nearly parallel beam is for ion scattering analysis to maintain energy resolution. For MSRI, the scattering angle is not as sensitive, the main restriction being that the recoiled ions of the proper pass energy are directed into the sector. Therefore, a convergence of 3 degrees would be usable and could be accomplished without significant spherical and chromatic aberrations. This would increase the current into a $0.25\times1$ $mm^2$ spot size by a calculated factor of 14 which when combined with measured current density gives an extrapolated current density 11.2 $ma/cm^2$ using the present source.

Improvements to the Cs source can be accomplished by modifying an existing beamline and adding it to the chamber through the 4.5" port which is nearly orthogonal to the existing beamline as shown in FIG. 1. In this way, merely by sample rotation, a choice can be made between MSRI with the Cs source or DRS/ISS with the existing beamline.

A block diagram illustrating ion pulse formation and the timing electronics necessary to measure the direct recoil TOF is shown in FIG. 2. The continuous 15 KeV Cs ion beam enters through the first slit 54 and is deflected.

to the left by a DC bias of $-125$ V applied to the first deflector 15. Negative $-250$ V pulses are applied to the second deflector 17 at the rate of 18 kHz. The effect of this voltage pulse is to move the ion beam to the right, sweeping it past the second slit 67. One ion pulse 18 is thus formed when the pulsed voltage to the second deflector 67 goes to $-250$ V and another is formed when the voltage on the second deflector 17 relaxes to 0 V. The time between these two pulses is controlled by the width of the voltage pulse to the second deflector 21. This second ion pulse can be Purged by application of a second, delayed voltage pulse to the third deflector 16 so that the "flyback" pulse generated by the relaxation of voltage to the second deflector 17 occurs beneath the second slit 67 as shown by the dotted arrows. Both single pulse and double pulsed modes are used.

The total recoil angle is 35 degrees and the sample 21 is oriented at the specular angle. The incoming beam has less than a 0.7 degree divergence and the measured spot size of the beam at the sample 21 is 0.25 mm $\times1$ mm. with the sample normal to the beam axis. When the sample 21 is rotated into the specular angle, as shown, the irradiated area of the sample increases to $1.28\times1$ $mm^2$. The path length difference for the primary ions hitting at either extreme of the irradiated area can be measured. From this length a transit time difference across the sample of 9 nsec can be calculated for 15 KeV Cs ions. The pulsed current intensity was 300 pA (at 18 kHz) which when spread into an area of 0.0128 $cm^2$ yields a pulsed flux of $1.5\times10^{11}$ $ions/cm^2/sec$.

A time-to-amplitude converter (TAC) is started when the voltage pulse is applied to the second deflector 67 to form the ion pulse 18. The ion pulse 18 crashes into the sample 21 with resultant scattering or desorption of surface atoms. When each of the particles reaches an ion detector a nanosecond wide signal is generated. This signal is used to stop the TAC. A voltage output is generated by the TAC whose amplitude is Proportional to the time between start and stop signals. This output is fed to a multichannel analyzer (MCA) operated as a pulse height analyzer. If the count rate is around 3 kHz (i.e. 6 ion pulses hit the sample before one particle is detected) then an undistorted histogram of intensity vs TOF is recorded in the MCA. A time to digital converter (TDC) coupled to an integrating histogramming memory (IHM) may be substituted for the TAC/MCA and is the preferred embodiment.

The energy filters define a narrow energy slice of ions and have an angular acceptance of 0.8 deg. It is designed so that particles originating from a spot on the sample will be refocused in space and time at the ion detector. The design compensates for the spread in kinetic energies of the ions by having the faster ones spending more time in the energy filter than the slow ones so that they all arrive simultaneously at the detector. The TOF of an ion through the sector is given by:

$$TOF \rightarrow T_P + K(M_R/e)^{\frac{1}{2}} \quad \text{(Eq 1)}$$

where $T_P$ is the time the primary ion hits the sample, K is a constant relating the sector voltage to the kinetic energy of the passed ions and $M_R/e$ is the mass/charge of the ion being passed.

An example of a pulse sequencer 49 is seen in FIG. 3. The 34 cm field free linear flight path 140 between the sample 21 and the entrance to the sector 143 can be divided into 34 pairs of deflector plates 146, alternate pairs being grounded. A square wave generator is used to impress 100 V on the biasable plates starting when the primary ion pulse strikes the sample 21 and stopping when an ion of interest has the proper energy and emerges from the first grounded region. For a uranium recoil and a pulsed ion energy of 10 KeV this is about 900 nsec. As the ion exits the grounded region, the voltage is dropped to zero during the time of flight of analate ion through the pulse plates 146. Once the first ion packet is into the second grounded region another primary ion pulse should be generating a second ion packet so that after seventeen pulses all grounded regions are filled with ions of interest.

Figure 8:
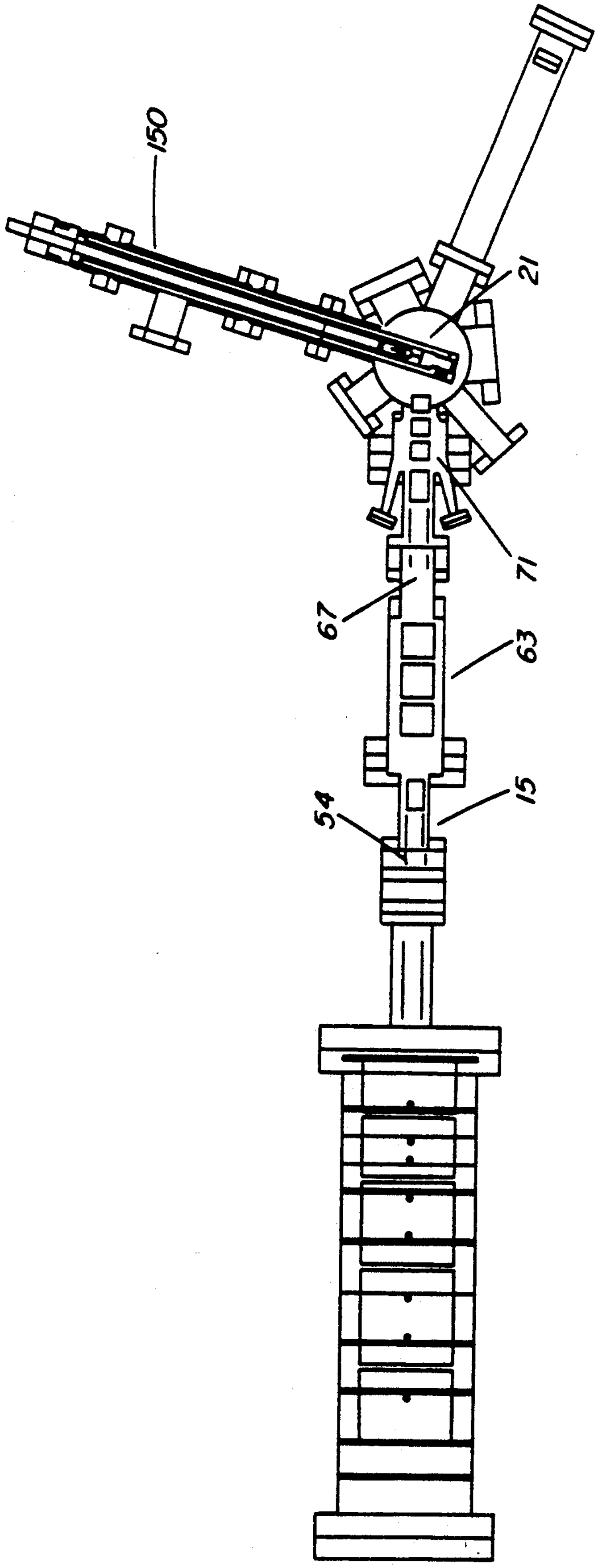
FIG. 8 is a schematic for high pressure direct recoil spectrometer and chemical vapor deposition cell.
Figure 9:
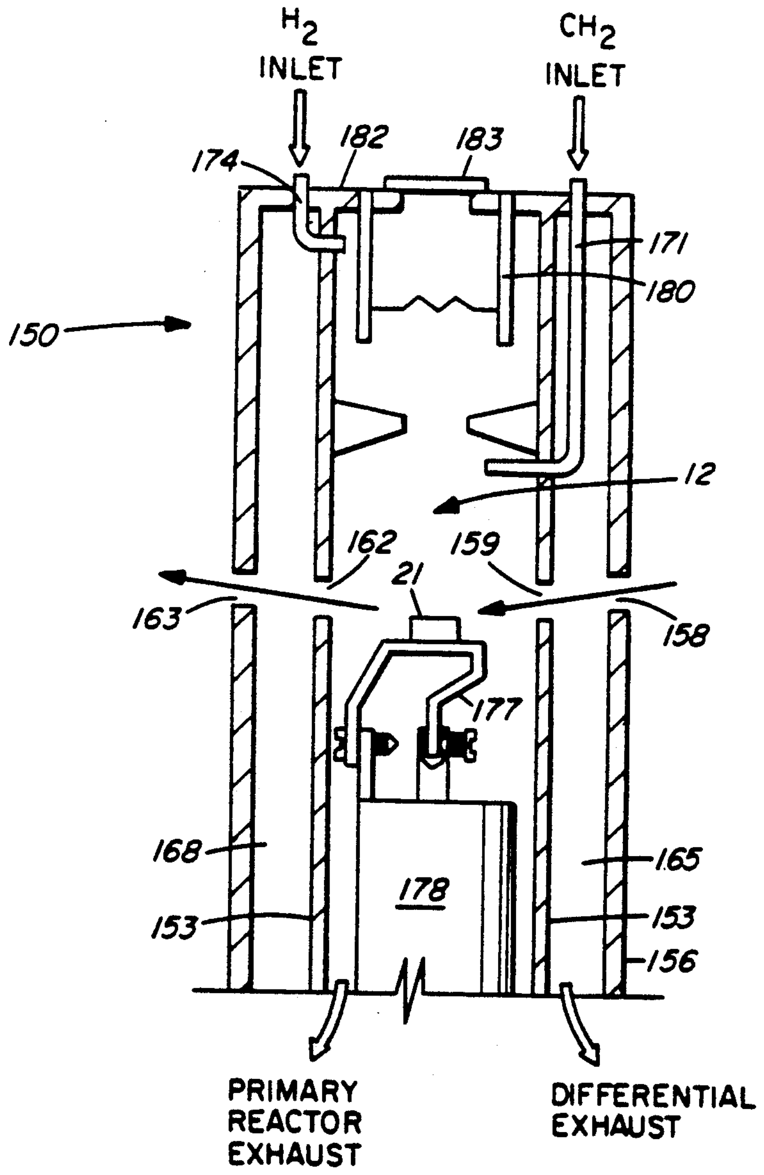
FIG. 9 is a schematic of the chemical vapor deposition sample chamber and showing differentially pumped high pressure ion beam interface.

The chemical vapor deposition chamber 150 with differentially pumped vacuum interface is shown in FIG. 9. As can be seen in FIG. 8 the chemical vapor deposition cell includes an inner-jacket 153 with a slit 159 for the passage of the incoming ion beam and a slit 162 for exit of the outgoing recoil or scatter ions. Outside of the inner-jacket 153 is an outer-jacket 156. The space between the inner-and outer-jacket has a differential exhaust turbo mechanical pump 165 for pumping out the gas maintaining the differential pressure between the sample chamber 12 and the beam line and detection chambers. The sample chamber can be at a pressure of 1 Torr, whereas the ion beam and detection chambers are at pressures less then $10^{-5}$ Torr. Also shown is a path where the primary reactor exhaust with mechanical pump 168 is removed from the sample chamber. In some embodiments of the sample chamber there is a heater 177 for heating the elements in annealing stage. There are also ports for methane inlet 171 and a hydrogen inlet 174 as well as a filament assembly 180 and a window to view the sample chamber 183. The ability to have the differentially pumped sample chamber allows the detailed measurements of DRS on growing surfaces.

A novel beam line for diamond surface studies includes a final 11° deflector assembly permitting direct line-of-sight view of the sample through the ion beam aperture from a 1.33" window on the 6" mounting flange. Ion optic models used in the design process are shown in FIG. 10. This design permits us to perform laser ellipsometric measurements on the same portion of the sample surface probed by the ion beam without additional apertures and pumping capacity.

The successful chemical vapor deposition cell design used in this work is shown schematically in FIG. 9. The actual chemical vapor deposition chamber 150 consists of a 19 mm diameter copper tube first jacket 153; it contains the sample rod, and is in turn enclosed by a 31.75 mm diameter stainless steel tube second jacket 156. Each of these jackets has a pair of diametrically opposed 500 micron slits 158, 159, 162 and 163 to permit passage of the pulsed ion probe and the recoiled surface particles. The annular space was differentially pumped by a Balzers TCP-050 turbo molecular pump 165. The main chamber was pumped by an Alcatel 90 l/s turbo molecular pump, the ion source has an additional 25 l/s ion pump and the reaction chamber 12 is pumped by a mechanical pump 168. The sampleholder 178 consisted mainly of a 6.25 mm copper rod enclosed by a 12.5 mm copper tube. These were electrically insulated and concentrically located by teflon and macor sleeve inserts. Samples 21 were mounted on a 1.5×0.25 mm tantalum ribbon clamped between the rod and tube. A macor disk 182 sealed the end of the chemical vapor deposition chamber 150 and the annular space between the chemical vapor deposition inner-153 and outer-156 jackets. The disk also supported the filament posts 180, as well as a small window 183 for viewing the filament and sample surface 21. Resistively heated tungsten, 0.125 mm and rhenium 0.175 mm wires were used to generate atomic hydrogen. Five 1.5 mm dia. stainless steel tubes, and two 20 gauge copper wires were fed through the outer disk 182 assembly and run up the annular space between them to supply deposition gases and electrical power to heat the filament. Pressure in the chemical vapor deposition chamber was measured with a thermocouple gauge on one of these tubes. Hydrogen, methane, deuterium and $^{13}$C-methane were admitted through mass flow controllers connected to the remaining four tubes 174, 171. Hydrogen and methane were introduced to the chemical vapor deposition chamber separately. The particular arrangement allowed only hydrogen to pass directly over the filament; methane was injected downstream of this dissociator beyond a flow orifice. Flow and pumping rates were such that the gas/residence time in the cell was about 0.5 second. This arrangement prevents carburization of the filament.

One specific embodiment of the present invention is a method for isotopic ratio determination of elements on a metallic, semiconducting or insulating surface. This method includes the steps of pulsing an ion beam of at least about 2 KeV at grazing incidence to impinge the surface of the sample of interest and detecting the ionized elements directly recoiled from the surface with a high resolution time-of-flight mass spectrometer comprised of at least one linear field free drift tube and at least one toroidal spherical energy filter with a +/− V polarization to deflect positive or negative ions.

Another embodiment of the present invention is a method for determining the elements on a surface with high pressure mass spectrometry comprising the steps of pulsing an ion beam of at least about 2 KeV at grazing incidence of about 45° to 80° to impinge said surface and detecting direct recoiled ions with a mass spectrometer having a time-of-flight sector located at an elevation angle of about 0° to 85° and a channelplate detector for measuring of direct recoiled ions. In the preferred embodiment the sector is located at a scattering angle of 35°. In a preferred method 15 KeV Cs ion is used. The method of the present invention is applicable with a pressure from about $10^{-11}$ Torr to 1 Torr.

A further enhancement of this high pressure method is the quantitation of the elements on the surface. This enhancement comprises pulsing an ion beam of at least about 2 KeV at grazing incidence of 45° to 80° to impinge the surface; detecting positive and negative ions of elements recoiled from the surface of a first high resolution time-of-flight mass analyzer comprised of at least one linear field free drift tube and at least one toroidal or spherical energy filter with a +/− V Polarization on the sectors of the filter to deflect positive or negative ions, wherein the outer surface of said filter contains a hole; detecting direct recoiled ions and neutrals with a second mass analyzer attached to the first mass analyzer and positioned to detect ions and neutrals exiting through said hole wherein said second mass analyzer has a time-of-flight detector located at an elevation angle of 0° to 85°, an electrostatic deflection plate to separate negative and positive ions and neutrals and a channelplate detector with at least three anodes, said anodes detecting either direct recoiled negative or positive ions or neutrals; alternately, collecting data on the first and second mass analyzers at time intervals of 100 μ sec to 1 sec and comparing the detected to measure the ion fraction of the recoiled element from the second analyzer either serially or with alternate pulses during high mass resolution identification of the element with the first analyzer. This ion fraction when combined with the calibrated ion transmission efficiency of the first analyzer (MSRI) allows the MSRI measurement to become a quantitative technique for elemental analysis. The procedure is calibrated with standards. The standards may be prepared by evaporation of a calibrated dose of an element onto a surface. Various surface coverages (concentrations) are prepared and MSRI and ion fraction measurements are made as a function of this coverage. The coverage is verified by other surface sensitive techniques such as Auger electron spectroscopy (AES) or X-ray photoelectron spectroscopy (XPS). An alternate preparation of standards would be to ion implant the element of interest into a material, for example P in Si. The amount of material is verified by the ion dose and by Rutherford backscattering (RBS). The use of both types of standards allows the measurement of the ion fraction at a specific coverage (concentration). At dilute coverages the ion fraction is shown to be constant with coverage. The MSRI signal intensities at dilute coverage can then be turned into an absolute measure of the element. This is done by using the ion fraction and MSRI signal intensity at higher coverage which was independently verified by the other techniques, to calibrate the MSRI signal to a known elemental concentration. The power of the combined MSRI/ion fraction measurement is that the change in MSRI signal strength from matrix influence on the recoiled ion fraction can be exactly measured in contrast to SIMS.

In the preferred embodiment the TOF detector is located at an angle of 35°, the pressures are $10^{-11}$ Torr to 1 Torr, the surface is preferably coated with an overlayer of frozen noble or molecular gases which serve to reduce sputtering of the surface layer. Also the recoiled elements can be stripped and ionized by passing through this overlayer. This effect may reduce the dependence of the recoiled ion fraction on the matrix.

Another high pressure embodiment is a device for real time stoichiometry measurements of a surface comprising: a sample chamber; an ion beam pulsing means oriented at an angle to the sample chamber generating a pulsed ion beam at a grazing incidence to impinge the surface of a sample in the sample chamber; a micro capillary gas doser to form a local area of high pressure on the surface; a first array of discrete detectors (one skilled in the art will recognize that the discrete detectors can be a variety of devices, some examples include channelplate, channeltron and continuous dynode detector) in the forward specular hemisphere to measure forward ion scatter from the ion beam impinging the surface, said first array including up to about 100 discrete detectors each defining a scattering angle of $\pm 0.5°$; a second array of discrete detectors in the back specular hemisphere to measure the backward ion scatter from the ion beam impinging the surface, said second array including up to about 100 discrete detectors each defining a scattering angle of $\pm 0.5°$; and A collection means to collect a multiplicity of time-of-flight data simultaneously from each detector in both the first and second array of discrete detectors.

In this device the primary angle of grazing incidence of the pulsed ion beam is about 45° to 85° relative to the normal; the angle of forward ion scatter is about 0° to 90°; and the backward ion scatter is 90° to 180°.

The gas doser must be of sufficient size to expose about a 100 $\mu$ diameter of the surface to a local pressure of up to about 100 Torr.

A further embodiment includes a device for performing DRS in a differentially pumped chamber comprising: a sample chamber, said chamber containing a first jacket with an entrance slit to allow access to the chamber by an ion beam and an exit slit to allow egress of the recoil or scattered ions, said slits further allow the sample chamber to maintain a pressure of 1 Torr; and a second jacket with the similar entrance and exit slits and a pump to remove gas from the sample chamber and maintain differential pressure between the sample chamber and an ion beam and detector chamber, wherein said ion beam and detector chamber are less than $10^{-5}$ Torr.

In a further embodiment the high pressure device can be designed for determining the real time stoichiometry during high pressure surface modification, in which case the gas doser is replaced with a device for depositing thin films on the sample. The deposition devices selected is from the group consisting of an elemental effusion source, a molecular beam source, a chemical beam source, a sputter deposition source, a laser ablation source, a plasma assisted chemical vapor deposition source and an atomic layer epitaxy source.

Further when the device is used to measure etching of surfaces the gas doser is replaced with an etching device selected from the group consisting of chemical beam source ion sputtering source, plasma sputtering source and laser ablation source. Additionally the device can be used in measuring annealing processes by the addition of a heating element.

A wide variety of surface elements can be measured using the apparatuses and methods of the present invention. In fact, the technique appears to be applicable to any element in the periodic table. The apparatuses and methods are useful in detecting and determining the isotopic ratios of elements selected from the group consisting of H, He, Li, Be, B, C, N, O, F, Ne, Na, Mg, Al, Si, P, S, Cl, Ar, K, Ca, Sc, Ti, V, Cr, Mn, Fe, Co, Ni, Cu, Zn, Ga, Ge, As, Se, Sr, Y, Zr, Nb, Mo, Ru, Rh, Pd, Ag, Cd, In, Sb, Te, Cs, Ba, La, Nd, Gd, Tb, Ta, W, Re, Os, Ir, Pt, Au, Hg, Tl, Pb, Bi, Th, and U. These are the standard international abbreviations for the elements in the periodic table. As this list indicates, a large variety of elements are detectable with this method.

In the methods discussed above, the system can include an overlay on the material of interest. The overlayer could be material contamination or could be intentionally evaporated or condensed onto the surface of the material of interest. The overlayer acts as a high pass filter of sputtered particles. The high energy recoils escape, while the predominant lower energy particles transfer their energy to the overlayer which is preferentially sputtered. The overlayer can be continuously renewed. The overlayer is effective even at a thickness as little as one or two monolayers. Examples of overlayer materials include hydrocarbons, carbon, gold, platinum, aluminum, oxides frozen noble gases and molecular gases. Some of these materials used for overlayers are found as contaminants on the surfaces to be analyzed; thus, the ability to analyze surfaces under the overlayer is an advantage of the apparatuses and methods. For example, the method is advantageous for use wherever hydrocarbons may contaminate surfaces. Further, in one embodiment of the method a hydrocarbon, carbon, platinum, gold, aluminum or oxide layer is added to facilitate the measurement, eliminate contamination and reduce sputtering of the surface during analysis. Another function of the overlayer is to form ions either by electron transfer (negative) or by stripping reactions (positive) as the recoiled analate elements pass through. Addition of elemental alkali (with subsequent oxidation) either from the primary beam or from an auxiliary source will enhance this effect.

One method of measuring elemental surface concentrations in high pressure in real time, comprises the steps of: impinging about a 100 μ diameter of a surface with the previously described high pressure device; detecting the forward direct recoiled ion and neutral profile from the impinging step with said first array of discrete detectors; detecting the low energy ion scattering from the surface with the first and second arrays of discrete detectors; multiply sampling the ion scatter at the rate of about 10 μ sec. to one sec.; and analyzing the data selected from the direct recoil scattering the low energy ion scattering or a combination of both.

Further methods of analysis include application of the above devices to real time stoichiometry during process control, deposition of elements on the surface, etching of elements on the surface and determining by blocking and shadowing analysis. In these instances the MSRI, the direct recoil, or low energy ion scattering or combinations of techniques can be used. In the crystallography analysis the ion beam scattering intensity is monitored as a factor of the scattering angles.

EXAMPLE I

Isotopic Ratio Determination

Isotopic ratio determination has been accomplished using a unique variant of time-of-flight (TOF) and low energy ion scattering spectroscopy (LEIS). The method includes mass analysis of ionized recoils produced by pulsed 15 KeV Cs ions impinging hydrocarbon coated surfaces of silicon, molybdenum, or uranium. The analysis has been carried out in a $10^{-7}$ Torr ambient hydrocarbon and water. The metal ion signals are attenuated by at least a factor of 4 under these conditions compared to the clean oxidized surfaces; nevertheless, a determination of $^{235}U/^{238}U$ in natural abundance uranium was made in 2.7 hours with 1% precision (i.e. 10,000 counts in a 235 peak). This time can be reduced to 30 minutes by a linear extrapolation of the experimental repetition rate from 18 to 90 kHz. One skilled in the art will readily recognize that other brute force improvements can reduce the time to under one minute.

The ability to analyze surface isotopes buried by these severe conditions of ambient hydrocarbon contamination is unique. No molecular ions have been found either from hydrocarbons or from metal hydrides or oxides. This makes mass assignments particularly easy. This is in contrast to secondary ion mass spectroscopy (SIMS) where such contamination is ubiquitous. The technique works on ungrounded metal foils implying that insulating surfaces are tractable. This method and the apparatus are simple, reliable, and relatively cheap compared to laser or accelerator mass spectrometer, or quadrupole SIMS systems. There are no moving parts and no magnets. A design useful for remote sensing can be envisioned.

EXAMPLE II

TOF/LEIS Analysis

TOF/LEIS a mono-energetic, pulsed noble gas beam is energy analyzed by TOF after scattering into a line of sight detector. The scattered neutrals have enough kinetic energy (greater than 2 KeV) to be detected by a channel electron multiplier with near unit efficiency, so that the ions and atoms are detected. The energy loss of the primary particle scattered into a specific angle after elastic binary collision with a surface atom is measured as a peak on the TOF spectrum. The mass of the surface atom is determined by application of equations for conservation of kinetic energy and momentum, assuming a single collision event. The relative intensity of the two scatter peaks in the TOF from a binary alloy surface can be predicted from cross section calculations using a Moliere interaction potential. Although the backscatter cross sections are not as accurately known in this low energy region as they are in Rutherford backscattering, measurements of the relative surface stoichiometry of alloy surface layers have been achieved.

EXAMPLE III

Detection of Direct Recoils

A technique for analysis of light elements on a surface has been developed using TOF detection of direct recoils (DR) by pulsed beam forward scattering. Unlike TOF/LEIS in which the energy lost from the primary ion is recorded, the surface atom is itself detected. A pulsed ion beam, for example, $K^+$at 3-10 KeV, is directed at grazing incidence onto a surface. This induces the direct recoil of a surface atom, or of an absorbed impurity at the surface. The direct recoils are ejected into a forward scattering angle with an energy predicted for a binary encounter:

$$E_R = E_p\,(4M_pM_R/(M_p+M_R)^2)\ \cos^2\Phi \qquad \text{(Eq. 2)}$$

where $E_R$ is the energy of the recoiled particle, $E_P$ is the energy of the incident primary particle of mass $M_P$, $M_R$ is the mass of the recoiled surface atom, and Φ is the recoil angle at which the direct recoil leaves, measured relative to the incident ion direction (see FIG. 1). Even though most of the recoils are neutral atoms, they have enough energy to be detected by a channeltron electron multiplier. By careful choice of $M_P$, $E_P$, and Φ, the oxygen (O(DR)), carbon (C(DR)), and hydrogen (H(DR)) can be resolved in the TOF spectrum. Because neutrals are detected, a spectrum can be obtained with primary ion doses of about $10^{11}$ ions/cm$^2$. This is about $10^{-4}$ of a monolayer. Thus, the technique is essentially nondestructive.

EXAMPLE IV

Mass Spectroscopy of Recoiled Ions

The mass spectroscopy of recoiled ions (MSRI) is another unique area for use of the instruments of the present invention. It is known that ions recoiled through an electrostatic sector can be mass analyzed. This has not been exploited as a surface analysis method because signal levels were considered too small and because mass resolution was considered inadequate.

The present invention implements a unique MSRI by placing an energy/time refocusing electrostatic sector analyzer similarly to that seen in FIG. 1 so that it is in the direct recoil forward scattering angle. Addition of this sector allows energy analysis and time refocusing of direct recoiled ions, which increases the precision with which the masses are measured. Mass resolution of TOF sectors are typically between 500 and 5000 at mass 400. Surface uranium for example has been desorbed by a 10 KeV Cs pulsed (10 nsec) ion beam impinging at 75°. The energy transferred to 235 and 238 isotopes recoiled into a 30° angle by a binary collision is 7994.9 and 7996.5 eV respectively. Recoil cross sections are almost identical. The 235 isotope is only 1.0083 times faster than the 238. Thus, the reneutralization probability for the two isotopes as they leave the surface is going to be virtually identical since it depends on velocity. The difference in energy and velocity will influence the relative signal intensities only slightly. While the calibration of the intensities by standard samples is necessary, not more than a few percent difference exists between the MSRI intensities and the true elemental ratio.

The MSRI experiment was performed by impinging at least about 10 KeV pulsed Cs ion beam at grazing incidence onto a solid surface as shown in FIG. 1. The normal to the sample surface lies in the plane of the figure.

The MSRI analyzer used included two linear field free drift tubes on either side of a toroidal 164 degree energy filter whose sector halves can be polarized with +/− V for the deflection of positive ions. The outer sector half contains a hole so that a channelplate detector can be located at a scattering angle of 35 degrees with a line of sight to the sample. This is labeled 35° DRS (Direct Recoil Spectroscopy). The situation will now be considered with both sector halves grounded so that ions and neutrals bash into the 35° DRS detector.

The energy transferred from the primary ion to the recoiled surface atom can be calculated by Eq. 2.

The recoil angle Φ was chosen to be 35° and the primary ion is Cs at 15 KeV. The energies and TOFs into the 0.43 m between the sample and the 35° DRS detector are shown in Table 1.

TABLE 1

| | 15 KeV Cesium DRS of H, C, Si, Mo and U | | |
|---|---|---|---|
| | Mass | Energy/eV | TOF/μsec |
| H | 1 | 299 | 1.80 |
| C | 12 | 3064 | 1.94 |
| Si | 28 | 5799 | 2.16 |
| Mo | 98 | 9859 | 3.10 |
| W | 186 | 9812 | 4.28 |
| U | 238 | 9283 | 4.98 |

Figures 4A, 4B:
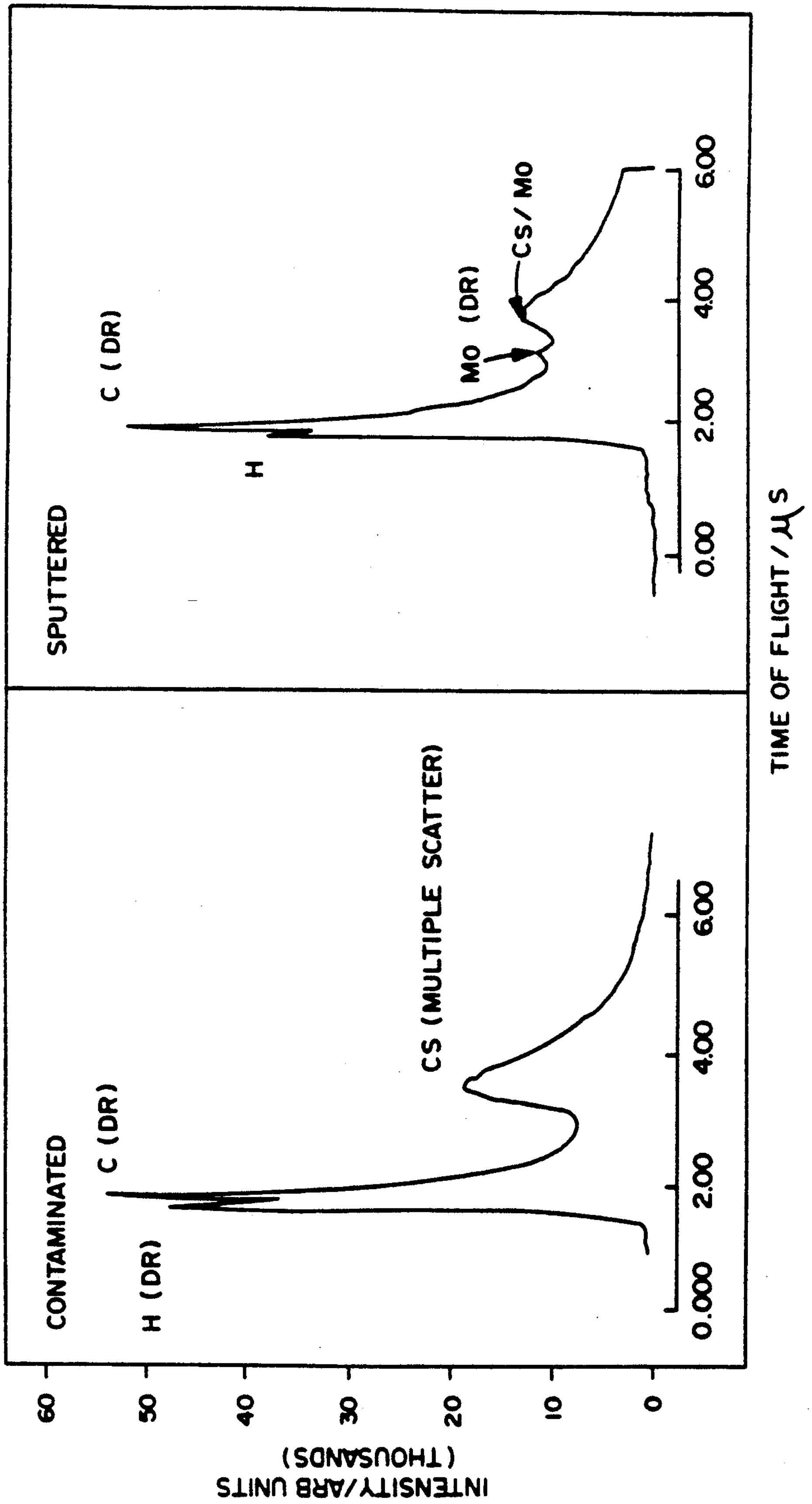
FIG. 4A -B is an ion profile from a time-of-flight mass spectrometer showing the measurement after sputtering of molybdenum foil contaminated with hydrocarbons at 15 KeV Cs source. The measuring direct recoiled ions were measured at 35°.

In addition to the DR, single scattering of the primary Cs from U and Mo Cs/U and Cs/Mo will occur at 3.24 and 3.96 μsec respectively. Two examples of DRS are shown in FIG. 4 one from hydrocarbon coated molybdenum foil and the other obtained after a partial sputter cleaning of the foil. The spectrum from the hydrocarbon coated Mo shows only the signature H(DR) and C(DR) from a hydrocarbon coated surface. The broad peak at longer TOF is a result of the primary ion losing energy as it penetrates the hydrocarbon overlayer(s) both in and out during scattering from the metallic underlayer. After sputter cleaning, the intensity of the H(DR) is reduced and both the Mo(DR) and Cs/Mo scatter peak are evident. All the recoiled ion data come from the hydrocarbon coated surface.

Another second MSRI experiment was performed by applying a voltage symmetrically to the sector analyzer as shown in FIG. 1. All the positive ions curved into the sector, all negative ions were bent to the left and only neutral particles continued to impinge the 35° DRS detector. As seen in FIG. 4 the DR peaks measured into the 35° detector were fairly broad. Converting from a time scale back to an energy scale showed that the H(DR) and C(DR) were several hundred volts wide and the Cs scattering peak was several thousand volts in width. The energy filter was designed for a resolution of 1% so that only 50 eV of energy was sampled from an ion peak with nominal kinetic energy of 5 KeV. Most DR particles are predominantly neutral. For both reasons the signal levels in MSRI are found to be several orders of magnitude smaller than in DRS.

EXAMPLE V

Trace Element Analysis

With MSRI, trace element detection, particularly for transition metals, will be possible at levels between 10–100 ppb in the near surface region, for example, the fourth to tenth monolayers. This technique has a tremendous sensitivity advantage over SIMS because no molecular complexes, for example, hydride, survive the recoil. In this respect it is like accelerator mass spectroscopy except an order of magnitude less expensive. The ionized fraction of the direct recoils can be very small or nearly unity depending on the element but is usually in the range of 10–20% for metals. The matrix effects on the ion survival probability are much less severe than in SIMS. The most important feature, however, is that molecular ions do not survive the direct recoil collision. Thus, analyzing for P in Si becomes a simple matter of resolving 1 amu and not $^{30}$SiH from P. In the present invention, the SIMS and direct recoil ion experiments can be done simultaneously by TOF. This is an important feature since it allows molecular and elemental identifications to be performed simultaneously in a single instrument.

Calibration of the MSRI signals to evaporated or ion implanted standards can make the technique quantitative. IT can thus be used as an accurate trace analytical tool, in addition to merely detecting the presence, of elements in a surface layer.

EXAMPLE VI

Comparison of MSRI with Existing Techniques

During MSRI, secondary ions are also formed. Because the primary ion beam is pulsed, the secondary ions can be extracted into a TOFR/SIMS sector simultaneously as the direct recoil and scattered spectra are collected. TOF SIMS has significant advantages over quadrupole based measurements. With suitable ion optics, most of the secondary ions produced can be extracted and analyzed. Transmission is constant for all masses, and all masses are recorded simultaneously. TOF/SIMS and TOF/direct recoil were performed simultaneously and clusters up to mass 400 were resolved with unit resolution. The direct recoil from these surfaces show resolution of the H, C and O atoms. These data demonstrate the potential of DR as a method for quantifying light elements on a surface, including hydrogen.

EXAMPLE VII

Isotopic Abundances on Surfaces

Figure 5A:
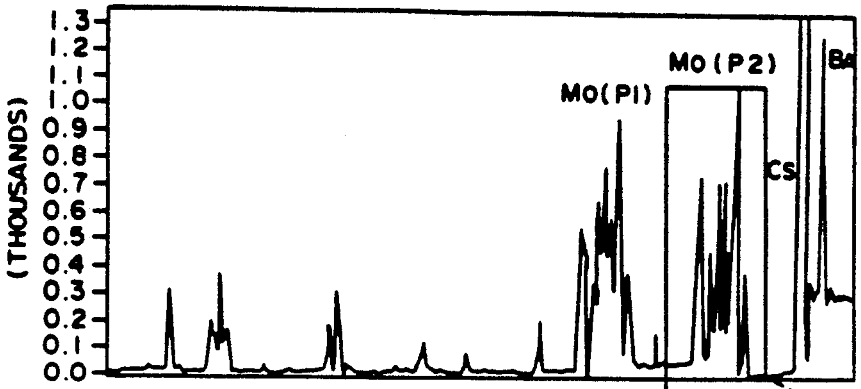
FIG. 5A–C shows the MSRI ion profile from the sputtering of a molybdenum sample.
Figure 5B:
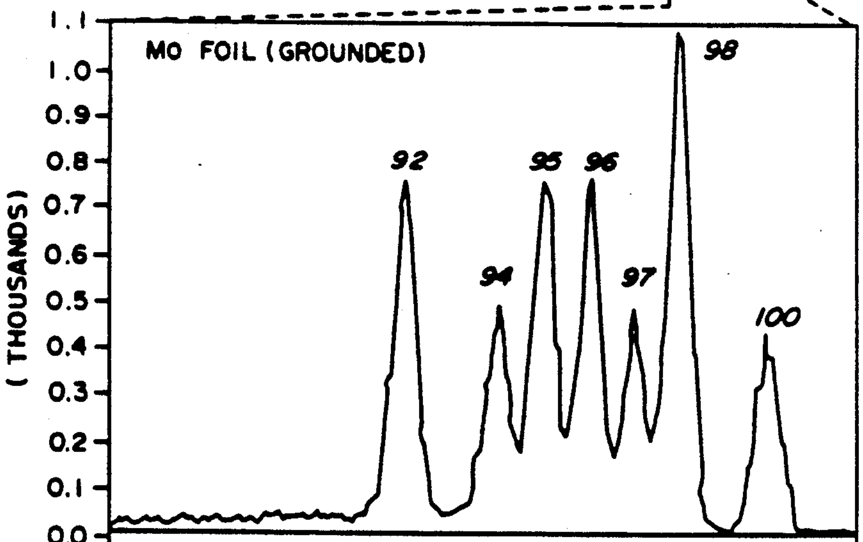
Figure 5C:
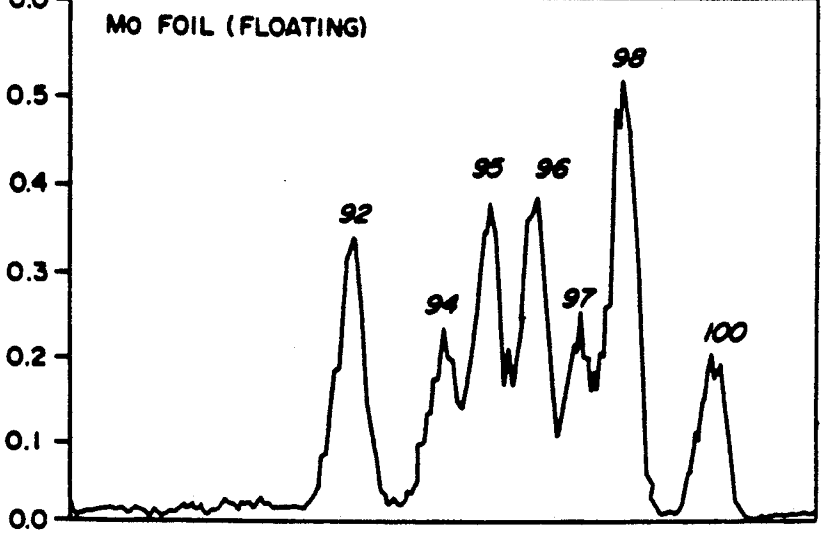

The data in FIG. 5 illustrate that direct recoil ions can be mass resolved by TOF with a cheaper experimental setup than that normally encountered in accelerator mass spectrometry. Survival probabilities of scattered molecular ions decrease rapidly as the scattering angle is increased above grazing, or the energy of the molecular ion is raised, 4° and 400 eV respectively. Recoiled ions are also free of molecular interferences, as long as recoil energies exceed a few KeV. In the MSRI technique, measurement of isotopic ratios on surfaces is simplified to the straight-forward application of high resolution TOF/Mass Spectroscopy simultaneously with TOF/SIMS, TOF/LEIS, and TOF/direct recoil.

Moreover, recoiled ions are not plagued by the reneutralization problem. Accelerator mass spectrometry relies on surface atoms being ionized by the sputtering process, but many elements sputter almost entirely as neutrals because the small velocity, about 20 eV average kinetic energy, allows time for efficient neutralization as the nascent ion leaves the surface. In contrast, recoiled ions have velocities several hundred times greater than sputtered ions. The probability of reneutralization exponentially decreases with increasing velocity, so reneutralization is much less severe for recoiled ions. Furthermore recoiled ions are almost exclusively formed by collisional Auger ionization of core hole levels. Such processes result in rather remarkable observations: for example, recoiled $O^+$ion fractions of 40% from MgO surfaces and recoiled $Mg^+$ion fractions of 15% from clean Mg surfaces. In the case of $Mg^+$, the direct recoil ion fraction increases by two upon oxidation of the clean metal while the $Mg^+$SIMS signal changes by three orders of magnitude. Hence, the sensitivity of MSRI can be enhanced for those elements not easily seen by normal SIMS or accelerator MS.

EXAMPLE VIII

Resolution

The theoretical resolution of the toroidal electrostatic sector to first order is given by $$R_t = ((3.77 r_0)/((2dt\,(E_R/M_R)^{\frac{1}{2}} + 0.9ds) \quad \text{(Eq. 3)}$$

where $r_0$ is the radius of the toroidal sector (15.25 cm), $E_R$ and $M_R$ are the energy and mass of the recoiled ion, and dt and ds are the time width of the ion pulse (25 nsec) and the spatial extent ($1.25 \times 1$ $mm^2$) of the ion pulse on the sample. The derivation of this equation assumes a 1.14 degree acceptance angle by the analyzer. Resolution experimentally $R_e$ is determined as TOF/2x-peak width (FWHM).

Comparison of $R_t$ with the $R_e$ is shown in Table 2. The analyzer acceptance angle is 0.8 degrees.

TABLE 2

| Theoretical and Experimental Resolution | | | |
|---|---|---|---|
| | Si | Mo | U |
| $R_t$ | 49.9 | 70.6 | 105 |
| $R_e$ | 125 | 175 | 120 |

The difference in theoretical and experimental resolution is presumably due in part to the smaller acceptance angle of the experimental analyzer.

Examination of Eq. 3 shows that the resolution at constant ds, dt, and angular acceptance is linearly related to the radius of the sector. Improvement in the resolution by a factor of 2 can be obtained by a brute force doubling of the size of the analyzer. This would allow slightly more than a doubling of the ion pulse width so that the MSRI signal is doubled at the same resolution as in FIG. 5 (15 minutes for natural abundance measurement).

Figure 6A:
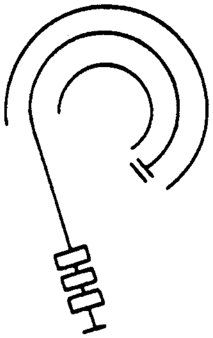
FIG. 6A–D is a schematic diagram showing a symmetric analyzer configuration of Poschenrieder and Sakurai.
Figure 6B:
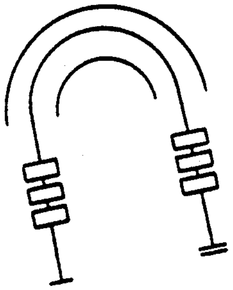
Figure 6C:
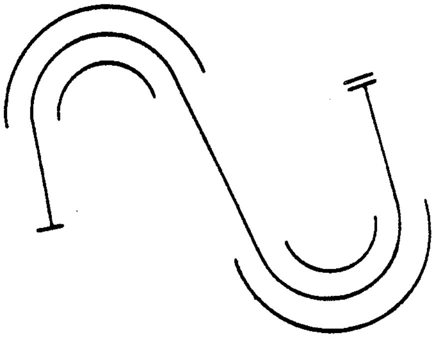
Figure 6D:
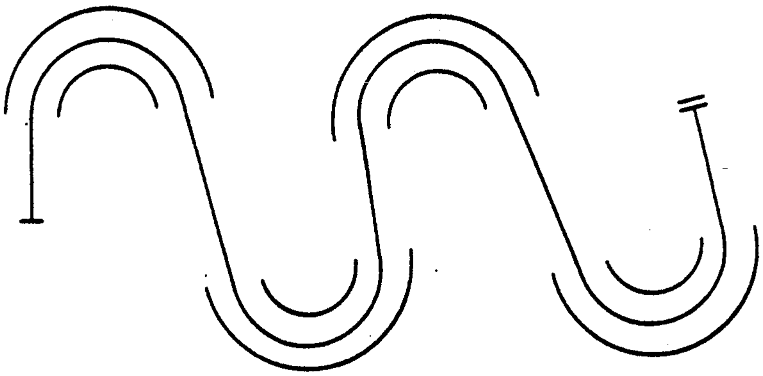

FIGS. 6*a* and *b* are a combination of lens and sectors while FIG. 6*c* involves only sector fields. Another configuration (FIG. 6*d*) puts two double sectors in tandem for a total of four sectors. The theoretical advantage of these configurations over the single sector arrangement is that the dependence of the resolution on ds is eliminated to first order for FIG. 6*a–c* and to second order for FIG. 6*d*. This means that in contrast to equation 3, the resolution no longer depends on the ion spot size on the sample. The reason for this can be understood qualitatively by comparing ray tracing in the single sector and in FIG. 6*c* for trajectories starting at the extremes of ds.

More than a factor two improvement in resolution can be seen by comparing the theoretical resolution for equal path lengths between our single sector ($R_t$=1140) and FIG. 6*c* ($R_t$=2970). The ion spot size is $0.5 \times 5$ mm, the angular acceptance is 1.14 degree (0.02 radian), and the total path length is 1 meter. In this analysis the ion pulse width dt is assumed to be zero (delta function).

EXAMPLE IX

Mass Selection with a Pulse Sequencer

Figure 7:
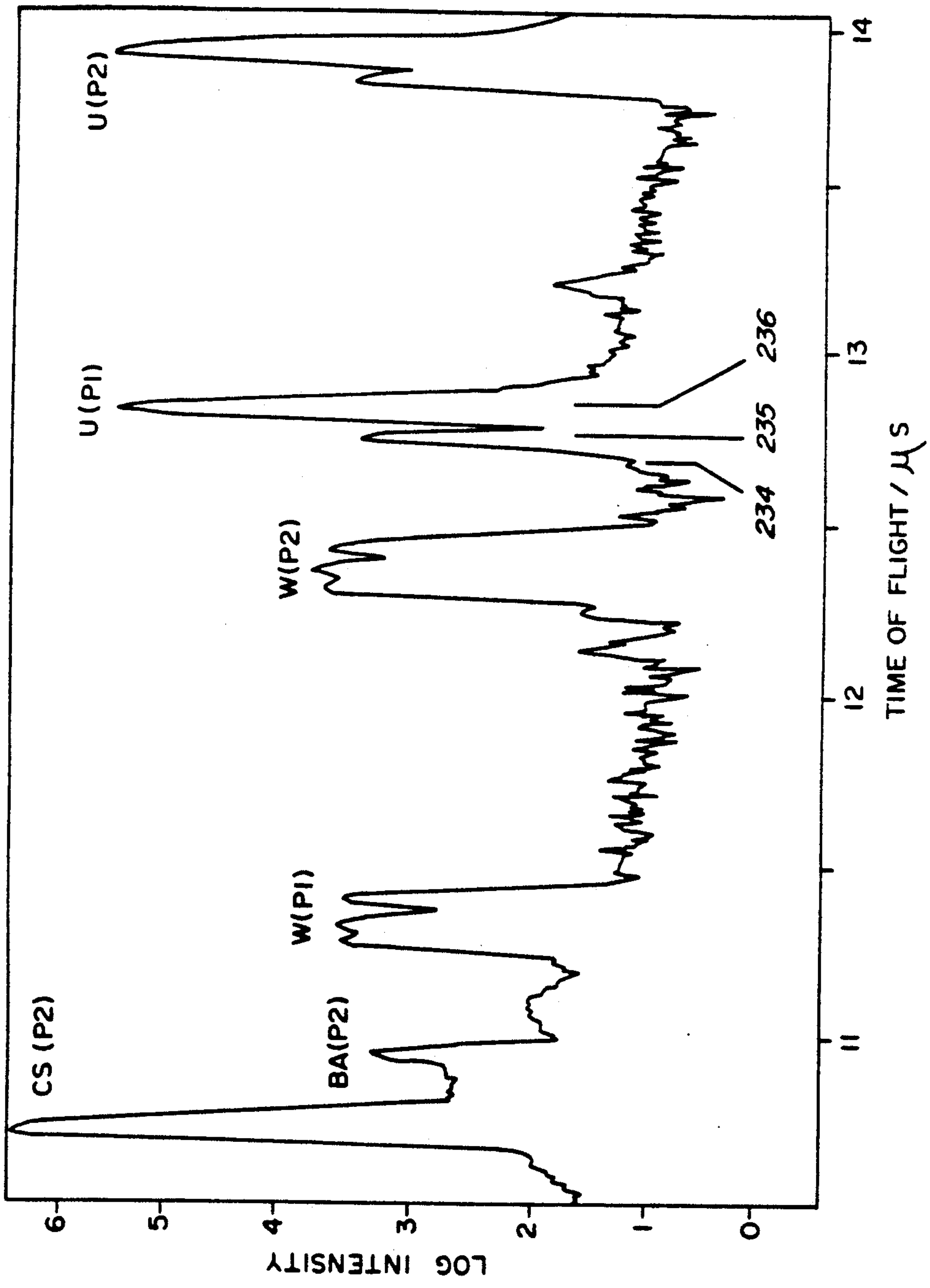
FIG. 7 shows the ion scattering profile from MSRI analysis from a sputtered uranium sample.

A rudimentary application of pulse sequencing for improved duty cycle is demonstrated for Mo and U in FIGS. 5 and 7. In FIG. 7 two U peaks are formed by P1 and P2. Two more pulses could be inserted between P1 and P2 so that four non-interferring U peaks would be present (factor 2 improvement in data rate). If no W were present the number of pulses could be increased to a total of eight without Cs interference. This would yield an increased data rate of four which when combined with a factor of two for the larger analyzer reduces the time for natural abundance analysis to 3.75 min. This approach will work as long as there are only trace interferences between mass 133 and 238 which should always be the case for pure uranium. In the preferred embodiment, however, a technique which would only pass masses 235 and 238 is desired. This can be achieved by incorporating the device featuring alternating deflector plates shown in FIG. 3. In a preferred embodiment pulses of U ions can be launched into the analyzer every microsecond or faster.

TABLE 3

| | Velocity (cm/usec) of MSRI ions with energy equal to the pass energy of U | | | | | |
|---|---|---|---|---|---|---|
| Energy | 238 U | 228 Th | 209 Bi | 186 W | 133 Cs | Na |
| 9183 | 8.653 | 8.844 | 9.122 | 9.787 | 11.57 | 27.83 |
| 9283 | 8.699 | 8.888 | 9.284 | 9.840 | 11.64 | 27.98 |
| 9383 | 8.746 | 8.936 | 9.333 | 9.894 | 11.70 | 28.13 |

The Bi (9183) at 209 will be a full cm out of phase from U (9383) after traveling 18 cm and so enter into a pulsed region. The Bi will be deflected by five additional pulses as it continues toward the sector. By the same argument Cs is out of phase after going 2 cm and will experience 5 or 6 deflection pulses on its way to the sector. A problem exists with this approach for the very light ions. A 10,000 volt H for example would be through the sector and onto the detector after 1 usec, thus, it would traverse all 17 biased plates during the time U was lumbering from the sample through the first grounded region. However, no 10,000 volt H exists in this experiment. H obtains only 300 eV from 15 KeV Cs bombardment and is thus eliminated because it does not have the proper pass energy. An extreme case is presented for Na. The DR by 15 KeV Cs would produce nominally 5,000 eV Na ions, but it is conceivable that a small portion could have 9283 eV as a result of multiple collision sequences. However, Na like H, would pass by many (about 10) biased plates while U was traveling through the first grounded region.

The number of purging pulses after an ion pulse arrives can be selected by a pulse sequencer. In this way the elimination of all spurious masses can be tested by impinging a primary pulse and clocking the purge sequencer until the one uranium ion packet is into the sector. Purging is continued until this packet arrives at the detector. If all is operating properly then the first 12 usec of the flight time should exhibit no signal other than dark count. The purge amplifier will have a 50% duty cycle capability (square wave) but will in addition have programmable selection of smaller on-times. A modest pulse rise and fall time of 20 nsec are all that is required for this application.

One potential problem with the purging approach will be that the U ion packet with an energy width of 200 eV spreads spatially as it flies toward the sector. Some mass discrimination will occur if part of the 200 eV wide 235 packet protrudes into the pulsed region. However, under the conditions of the present invention this should not be a significant problem. Furthermore, the energy window of the sector is 100 eV at 10000 eV pass energy. At worst this possibility means that the pulse plates would have to be lengthened with a subsequent decrease in the number of possible ion packets which could be transported without interference. Another way of looking at this is that the allowed mass range on either side of the uranium would have to be increased in order not to discriminate at mass 235.

EXAMPLE X

The equipment used to collect the DRS results is described above and is shown schematically in FIG. 8.

Single crystal diamonds have extremely high thermal conductivity, a large bandgap, high carrier mobilities and low neutron and ionizing radiation dislocation cross sections. These physical properties make it an ideal material in which to fabricate electronic devices for high temperatures, high frequency and/or high radiation service. Despite the significant body of work to date on low pressure chemical vapor deposition of diamonds, no methods now exist for manufacturing the large single crystal diamond substrates required to realize these potentials. It has recently become clear that the fundamental mechanisms of diamond's nucleation and growth must be determined before there is significant improvement in its process technology. Prior research, focusing on the gas phase chemistry in diamond low pressure chemical vapor deposition systems, has provided some valuable clues to possible mechanisms. However, chemical transport through the boundary layer to the substrate is still rather mysterious, and any conclusions about the environment at the growing surface based upon gas phase to date are speculative at best. The example describes the first direct probe for diamond surface chemistry under low pressure chemical vapor deposition process conditions i.e. in-situ direct recoil spectroscopy (DRS). In conjunction with previous gas phase results, this new tool provides the first comprehensive description of diamond low pressure chemical vapor depositions, enabling relatively straightforward determinations of both chemical mechanisms and improved process conditions for diamond growth.

Diamond crystals 1.5×1.5×0.1 mm, type IIA, <100> orientation, were affixed to the ribbon by spot welded Ta foil strips over two corners. The sample was positioned so that the exposed corners of the crystal were pointed along the path of the ion beam. This served to minimize the amount of DRS signal from the Ta ribbon in case the holder was slightly off center. Resistive heating to 1200° C. was achieved by passing 16 amps through the ribbon and temperatures were determined with an optical pyrometer. A total of three viton gland seals were fitted between the sample rod, chemical vapor deposition chamber, pumping baffle and main vacuum chamber. These permitted free rotational and axial positioning. The reactor assembly was first aligned on the bench using a HeNe laser beam, then installed on the DRS system. The relative positions of the various components were maintained and adjusted by lead screws mounted between the main chamber and support plates mounted under collars on the chemical vapor deposition chamber and baffle tubes. Adjustments were needed occasionally during deposition because thermal expansion of the sample rod and chemical vapor deposition chamber caused misalignment of the beam apertures and the sample. 7.5 KeV $Na^+$ were used throughout this work to probe diamond surfaces. Time-of-flight (TOF) spectra were recorded with a TOF+· data acquisition system running on an IBM-XT compatible computer. The beam was pulsed at a rate of 20 KHz. Passing the beam through four small apertures resulted in low count rates between 1 and 10 KHz, and spectrum integration times ranging from thirty seconds to ten minutes were required.

Figure 11A:
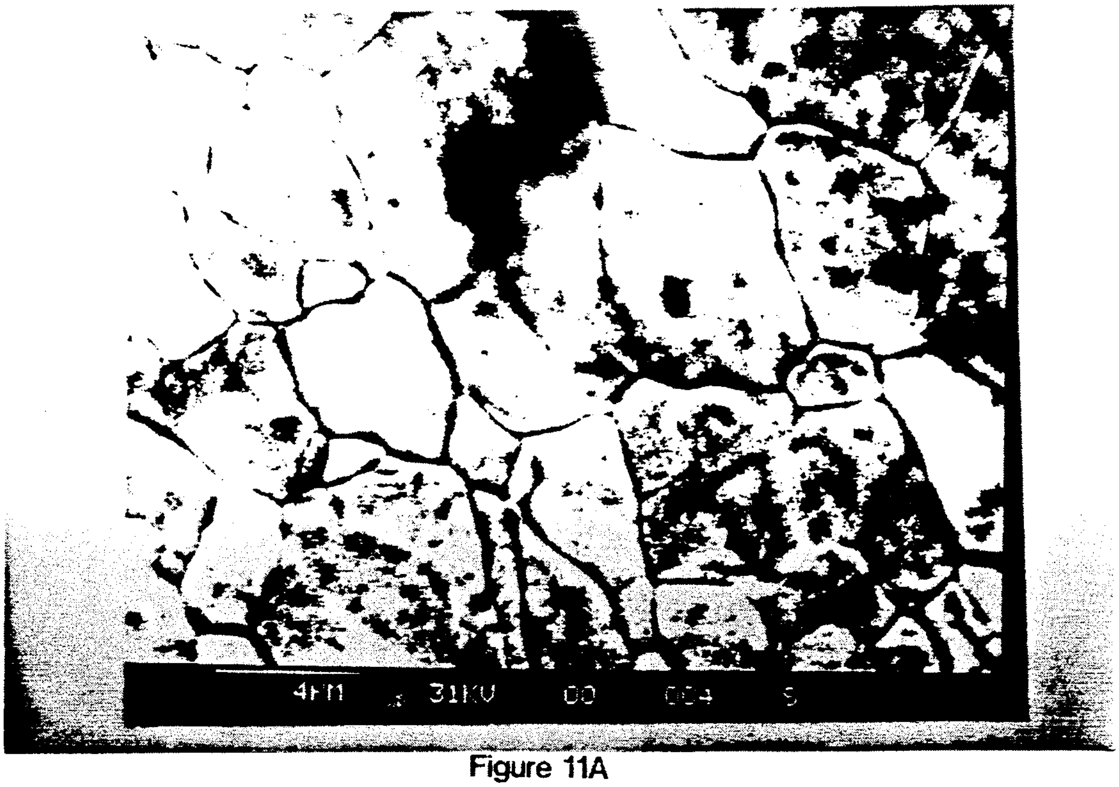
FIGS. 11A and B show the scan and electron micrographs of polycrystalline thin films deposited in the chemical vapor deposition DRS system at 0.3 Torr total pressure.
Figure 11B:
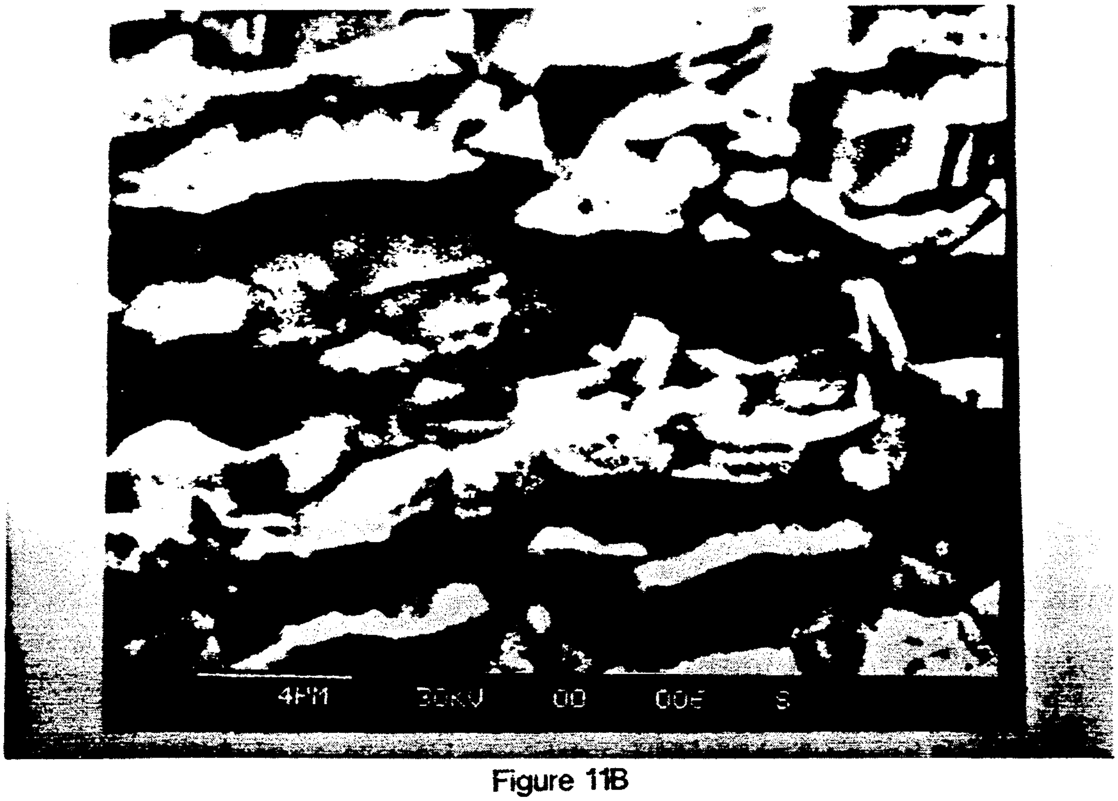

Chemical vapor deposition chamber growth conditions at 0.5 Torr were verified by depositing polycrystalline diamond films onto resistively heated tungsten ribbon. The ribbon was pre-nucleated by scratching with diamond paste. Grey-white films about 1 micron thick were deposited in a four hour deposition run. The films display polycrystalline habit. Most of the surface was quite smooth, although some slightly rougher areas were present as well, as seen in the SEMs in FIGS. 11A and 11B.

EXAMPLE XI

Figure 12:
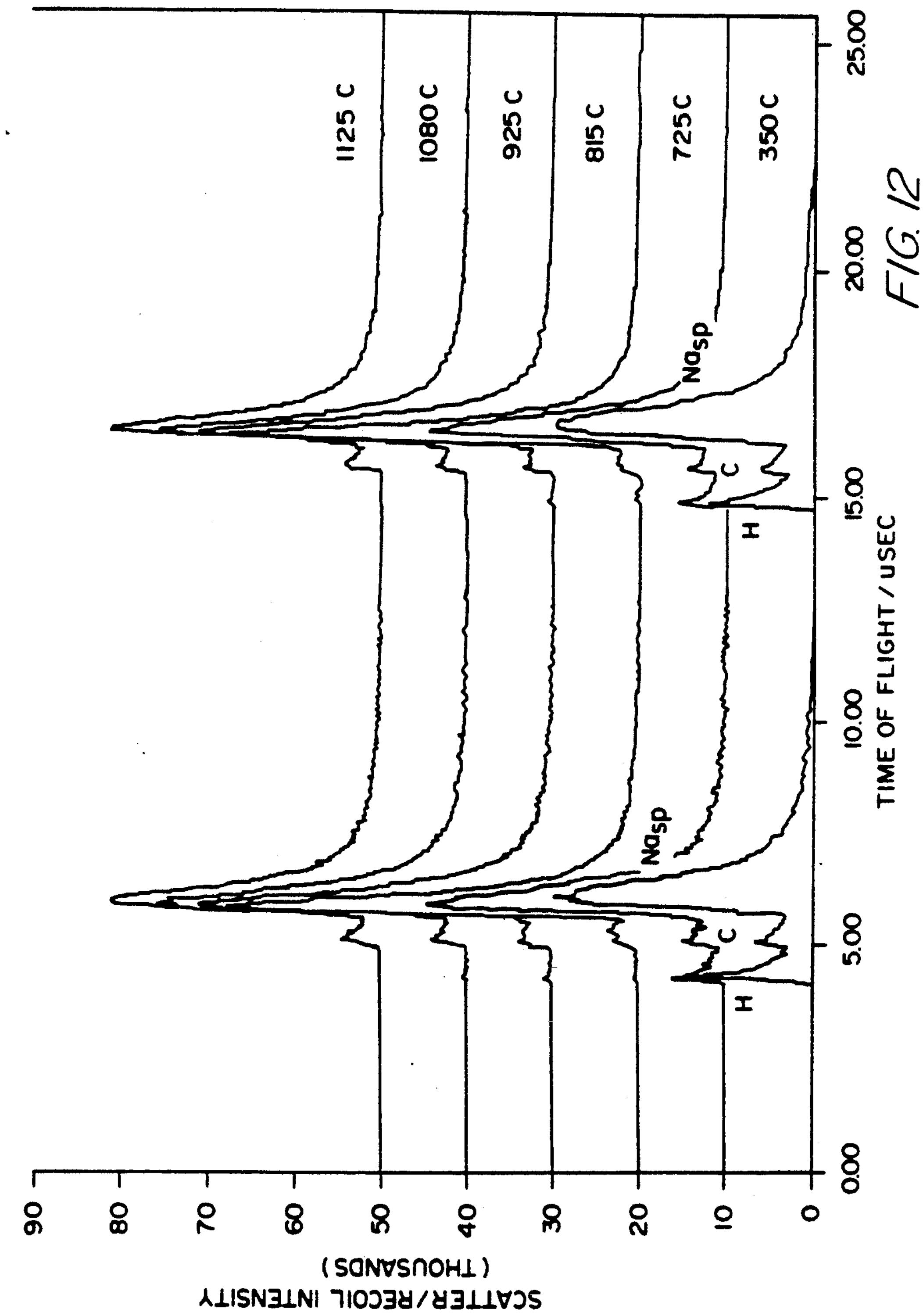
FIG. 12 is a scatter plot of the thermal program desorption DRS from diamond and vacuum.
Figure 13:
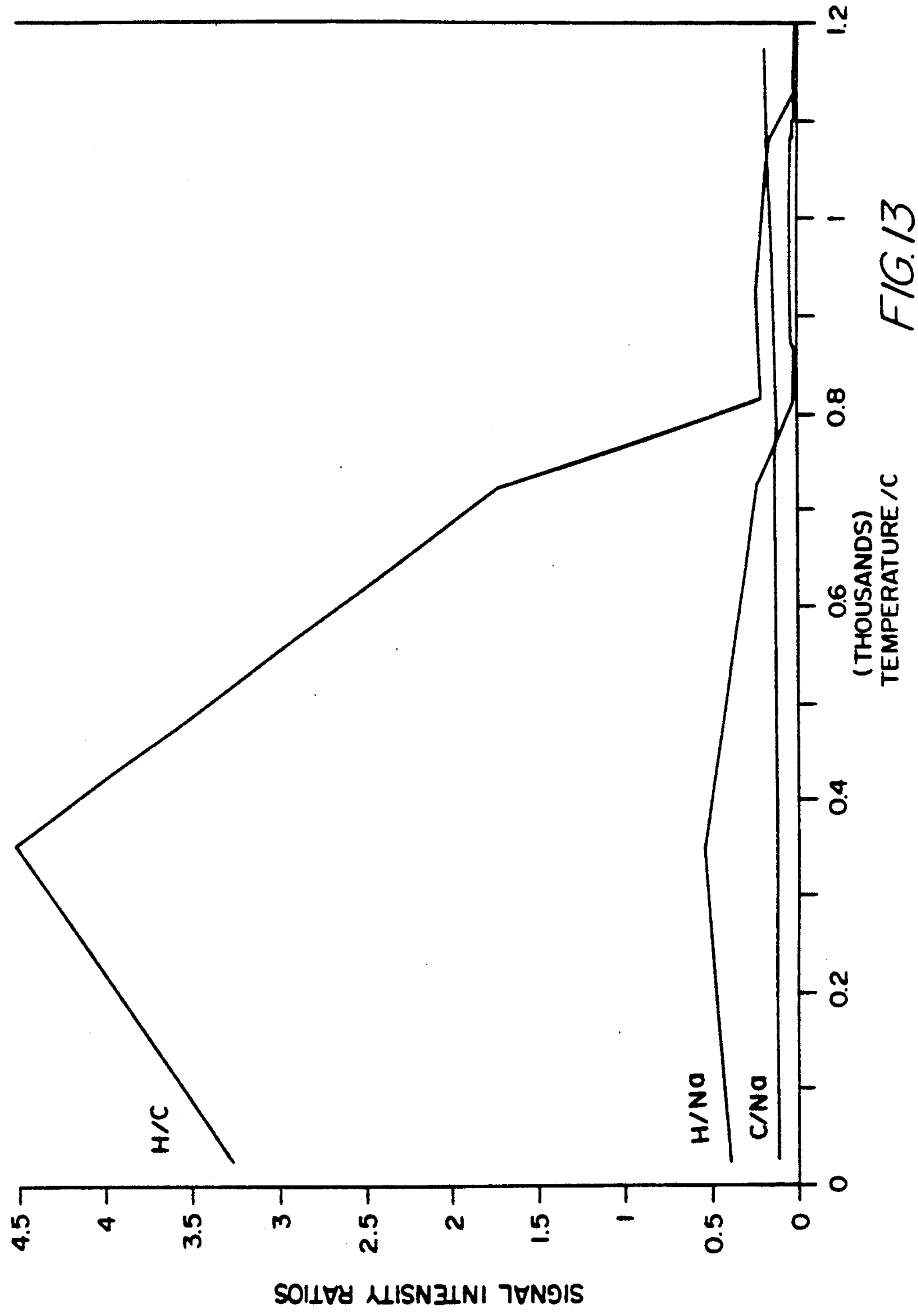
FIG. 13 is a graph of thermal program desorption of a surface species on the diamond.

Thermal desorption of native hydrogen on the surface of the diamond was first characterized by DRS in vacuo. These results are shown in FIG. 12. Note that each trace in this and several following figures represent two closely spaced TOF/DRS spectra. The ion beam is pulsed by electrostatically sweeping it with a pulse generator across a small aperture using a 200 volt step, 10 microseconds in duration. This results in two ion pulses and therefore two spectra. The pulse generator has a 25 ns leading edge and a 200 ns trailing edge. The first DRS spectrum has better temporal resolution, while the second has improved signal intensity. The TOF peaks resulting from surface hydrogen and carbon are labeled "H" and "C" respectively, the intense scatter peak arising from reflected sodium ions is labeled "$Na_{sp}$". the relative H and C peak heights at 350° C. are indicative of $CH_2$ stoichiometry, as expected. At 725° C. a partially dehydrogenated surface with approximate $CH_1$ stoichiometry was obtained. At higher temperatures, the surface was denuded of hydrogen. A plot of peak ratios versus temperature is shown in FIG. 13. The $CH_1$ surface could indicate a true stepwise reconstruction on this surface, or a equal mixture of bare and saturated surface sites. The intermediate state was generated from the saturated condition within two minutes at 725° C., remained stable for over thirty minutes and progressed to the bare state within two minutes upon elevation to 815°. Thus, it is postulated that a stable $CH_1$ surface exists.

Figure 14:
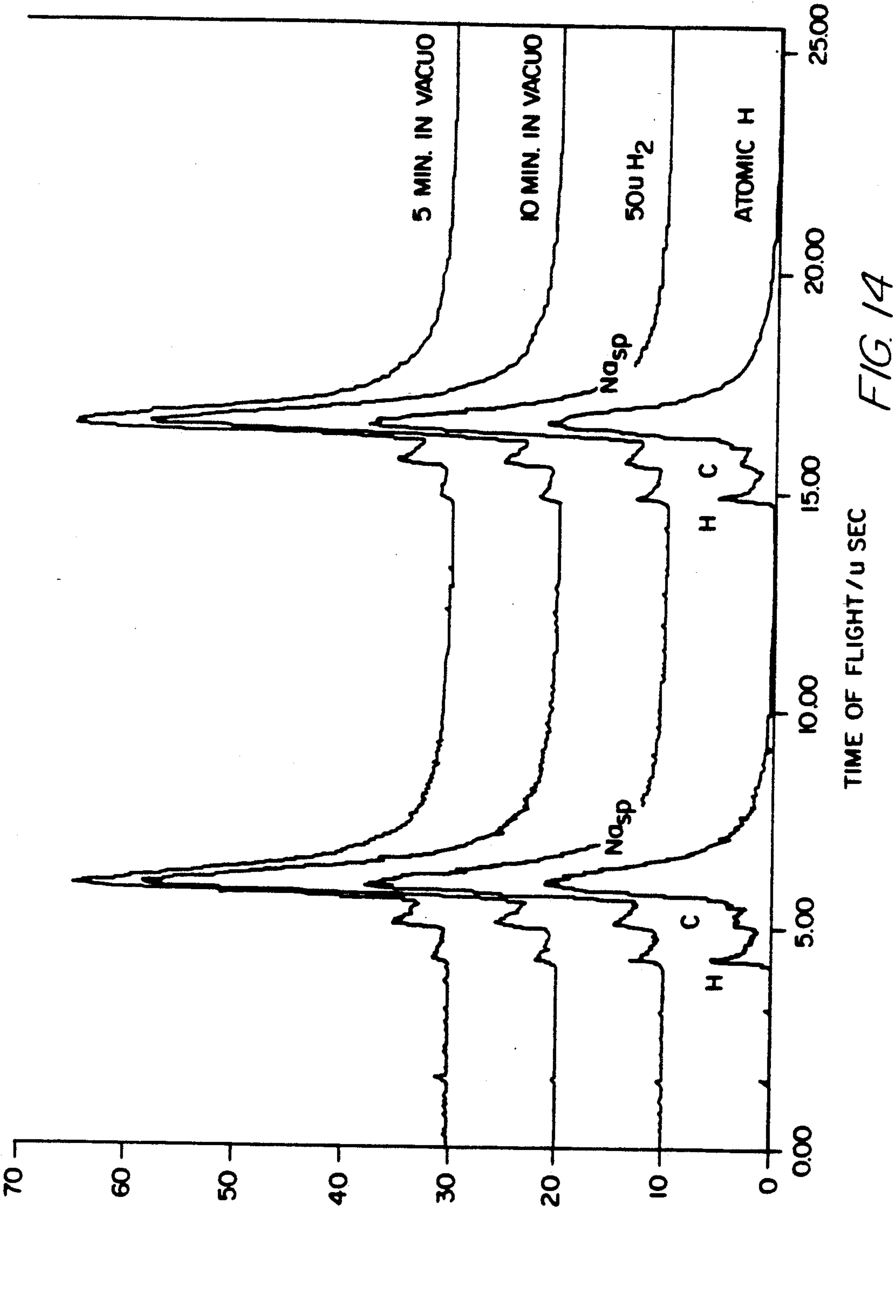
FIG. 14 shows surface rehydrogenation on the diamond.

Previous investigations using different techniques concluded that the reconstructed surface was chemically inert to molecular hydrogen. Atomic hydrogen was required in these previous experiments to transform the reconstructed 2×1 surface back to the original 1×1 image. The previous experiment unlike the present invention could only indicate the surface structure and not the amount of hydrogen present. The earlier conclusion was supported however, by the DRS results shown in FIG. 14. This sample was annealed at 1100° C. to remove hydrogen, then cooled to 350° C. for the experiment. At this temperature surface hydrides are stable, and residual hydrocarbon contamination condenses very slowly. A fully hydrogenated $CH_2$ surface was obtained only after exposure to atomic hydrogen from the filament. A slight increase in the hydrogen coverage did occur over about twenty minutes, including exposure to 50 microns of pure hydrogen. There exists a small possibility that the reconstructed surface had a very slow reaction with $H_2$. The residuals, however, in the non-reconstructed surface had a very slow reaction with $H_2$. These residuals in the non-ultra-high-vacuum chemical vapor deposition chamber could easily account for the observed amount of surface H. The inert nature of the reconstructed surface was also supported by a series of thermal desorption runs in ambient hydrogen at pressures up to 1 Torr. The results were identical to those from the above vacuum experiment. Thus, the results support the notion that the reconstructed surface is inert to molecular hydrogen.

EXAMPLE XII

Figure 15:
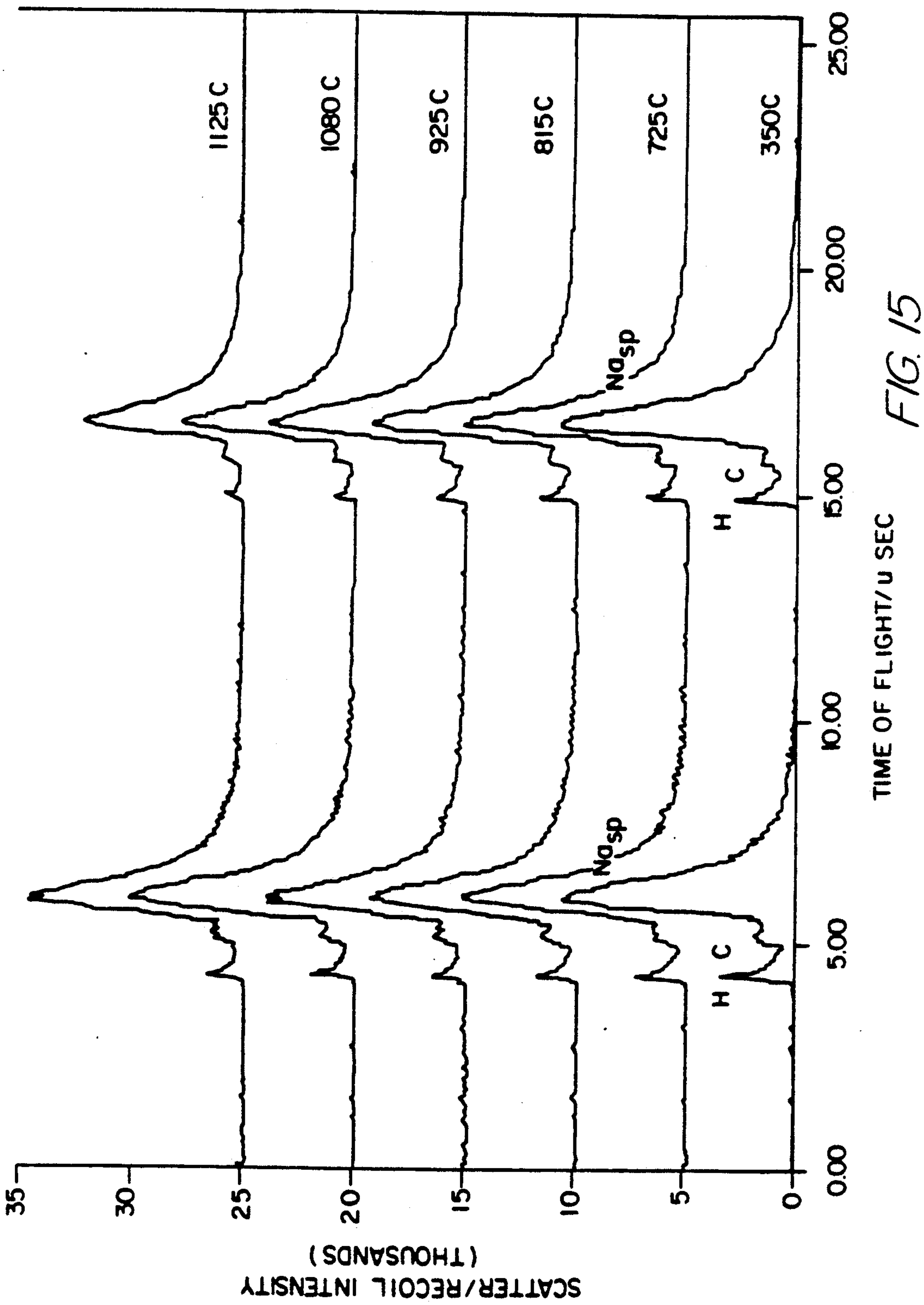
FIG. 15 shows a surface hydrogen coverage of a diamond under atomic H flux at a pressure of 330 $\mu$.
Figure 16:
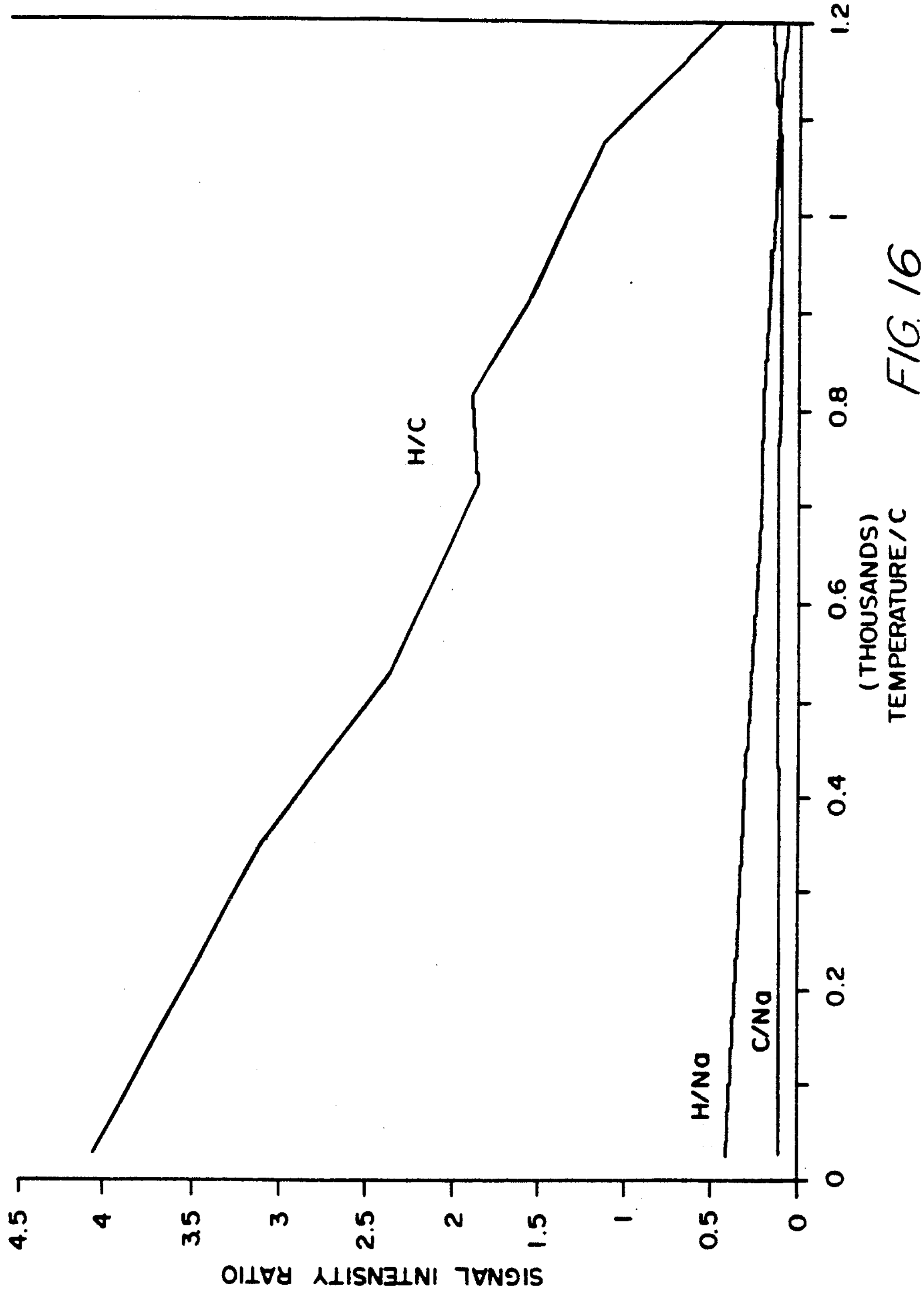
FIG. 16 shows a graph of surface hydrogen coverage on the diamond under atomic hydrogen flux comparing signal intensity ratio versus temperature.
Figure 17:
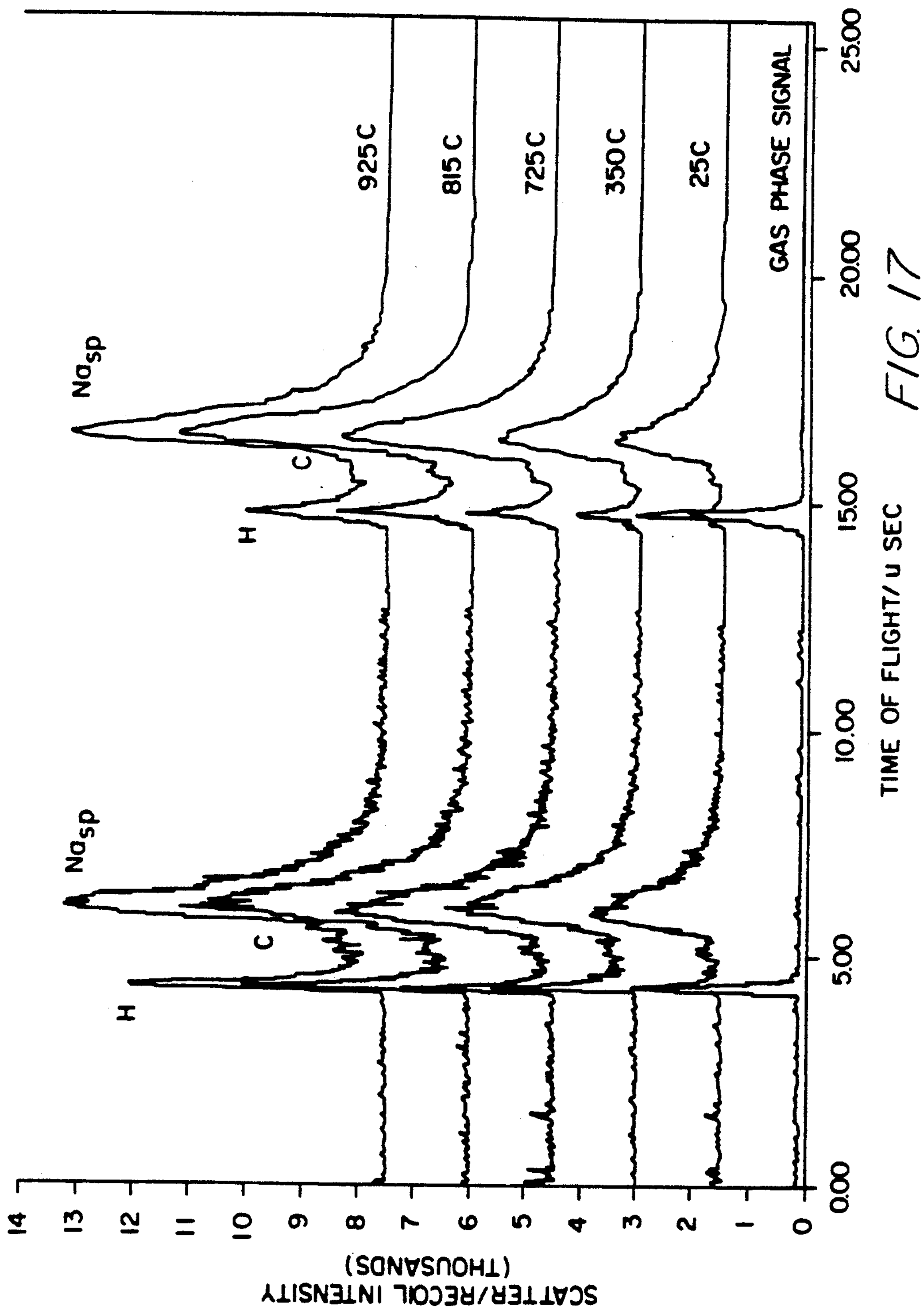
FIG. 17 shows the hydrogen surface coverage at 1 Torr on the diamond under atomic hydrogen DRS measurement and time-of-flight spectrometer.

A similar series of experiments performed in a partially dissociated ambient hydrogen provide a view of the dynamics of desorption versus hydrogen addition under growth conditions. Results taken under 0.330 and 1.0 Torr of activated hydrogen are shown in FIGS. 15 and 17 respectively. There still exists a clear trend toward reduced hydrogen coverage on the surface with increasing sample temperature. However, the surface never becomes completely denuded of hydrides. The peak ratios calculated from the 0.330 Torr data are plotted against sample temperature in FIG. 16. The expected attenuation of the DRS signal with increasing pressure in the chemical vapor deposition chamber was observed. At one Torr, for instance, the total count rate at the DRS detector was reduced by a factor of three. Surprisingly, a significant background of direct recoil intensity from the gas itself was observed. At one Torr, the gas phase H signal overwhelms the surface H recoils. The effect is somewhat less pronounced at 0.330 Torr. The gas phase signal has one characteristic sharp peak, unlike the surface recoils which have a tail on the long flight time side. This signature provides a kernel to use for background subtraction in future high pressure work. No correction was made in the current results, so the H/C ratios in FIG. 16, which were calculated using peak heights are systematically too high. The true surface concentration can be estimated from the height of the H tails just beyond the initial spikes generated from the gas background. Plainly, at typical growth temperatures above 800° C., the surface has at most one-quarter of a monolayer of hydrogen. In analogy to established work on reconstructed silicon surfaces, it was assumed that the dehydrogenated diamond surface consists of carbon dimers which are chemically joined by a double bond. This leads to the conclusion that the surface at least has a predominantly alkenic character under process conditions. Because there is some hydrogen present, it can be concluded that a variable steady state portion of these double bonds have undergone addition of atomic hydrogen. As a result they likely have an active free radical site. Apparently, the surface has sites which can react readily with both methyl radicals and/or acetylene. At this point, both are still good candidates for the diamond growth species, and it is inferred that the arrival and sticking of the carbon species is the rate limiting step in diamond chemical vapor deposition.

EXAMPLE XIII

Figure 18:
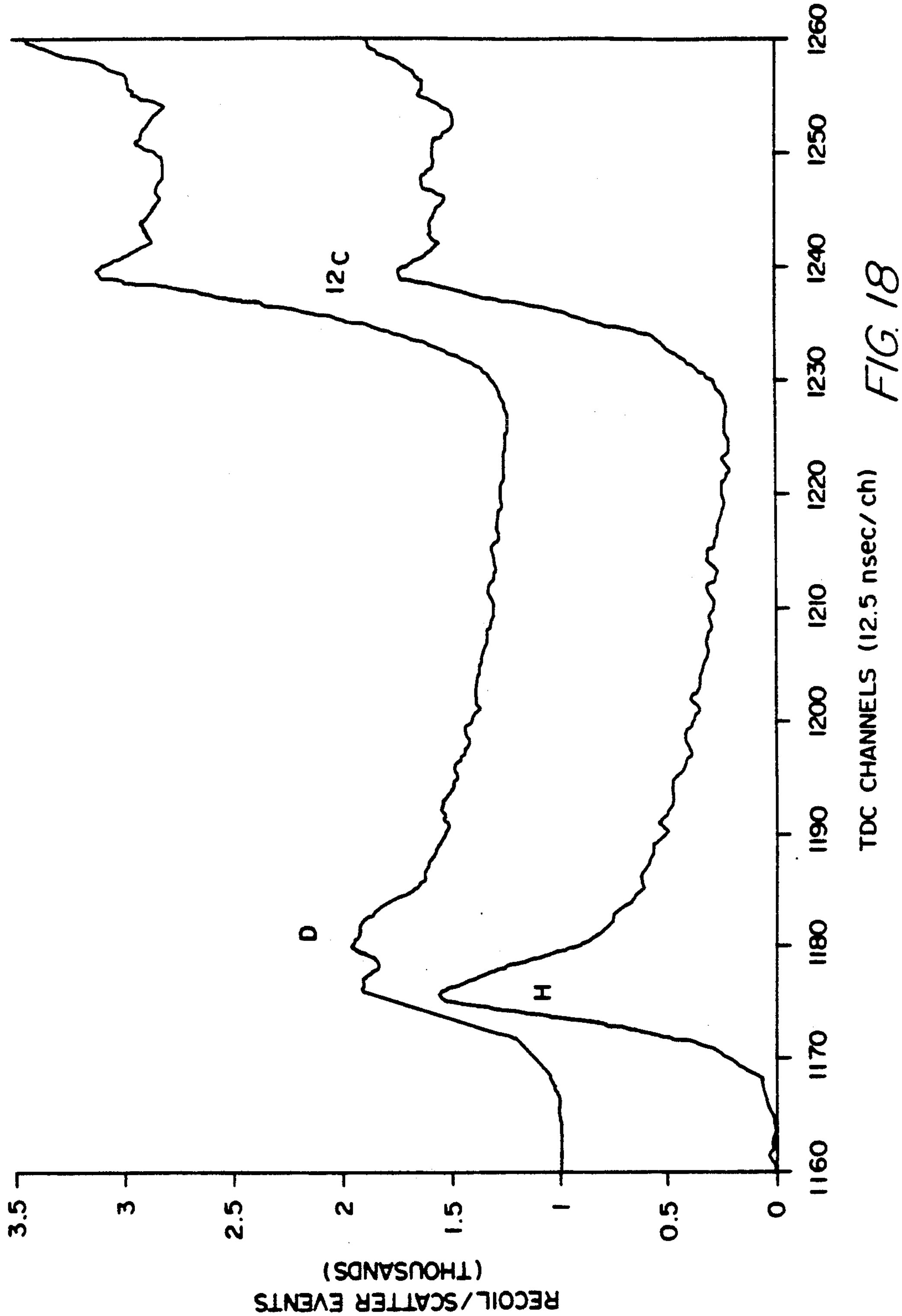
FIG. 18 shows H/D exchange on the surface.

Reversible exchange of hydrogen and deuterium on the surface was studied to test the hydrogen abstraction hypothesis of surface activation. It was expected that atomic hydrogen generated by the hot filament would abstract surface hydrides even at room temperature. This would leave radical sites which would recombine with subsequent hydrogen atoms. This, however, turned out not to be the case. DRS fingerprints for surface H and D were readily obtained by annealing the sample, then exposing it to either atomic H or D. Such spectra are shown in FIG. 18. The small D peak is expected because the direct recoil cross section of deuterium is only about 60% as large as that of hydrogen. Poor counting statistics resulted in fairly noisy spectra in the isotopic exchange work. The spectra displayed are from the second, more intense, DRS signal and have modest temporal resolution. The trace indicative of deuterium has no more than 25% hydrogen contamination in it. The exchange was performed exchange at a series of temperatures 300°, 500°, 600°, 700°, 800°, 900° C., using both activated hydrogen and deuterium at a pressure of 0.3 Torr. After each 30 second exposure, the gas was evacuated prior to taking the DRS spectra. Complete exchange occurred only at or above 700° C. At 600° C. there was partial exchange. At or below 500° C., there was no exchange between H and D. These results were confirmed by separate analyses. The consequence of this data is that surface exchange and therefore activation of the surface for diamond growth must be mediated by thermal desorption of surface hydrides to generate unsaturated carbon sites. Atomic hydrogen is apparently therefore not the surface activator, unless the abstraction process is highly surface temperature dependant, and happens to have the same threshold as desorption. This explains why diamond growth only takes place above 750° C.

EXAMPLE XIV

Figure 19:
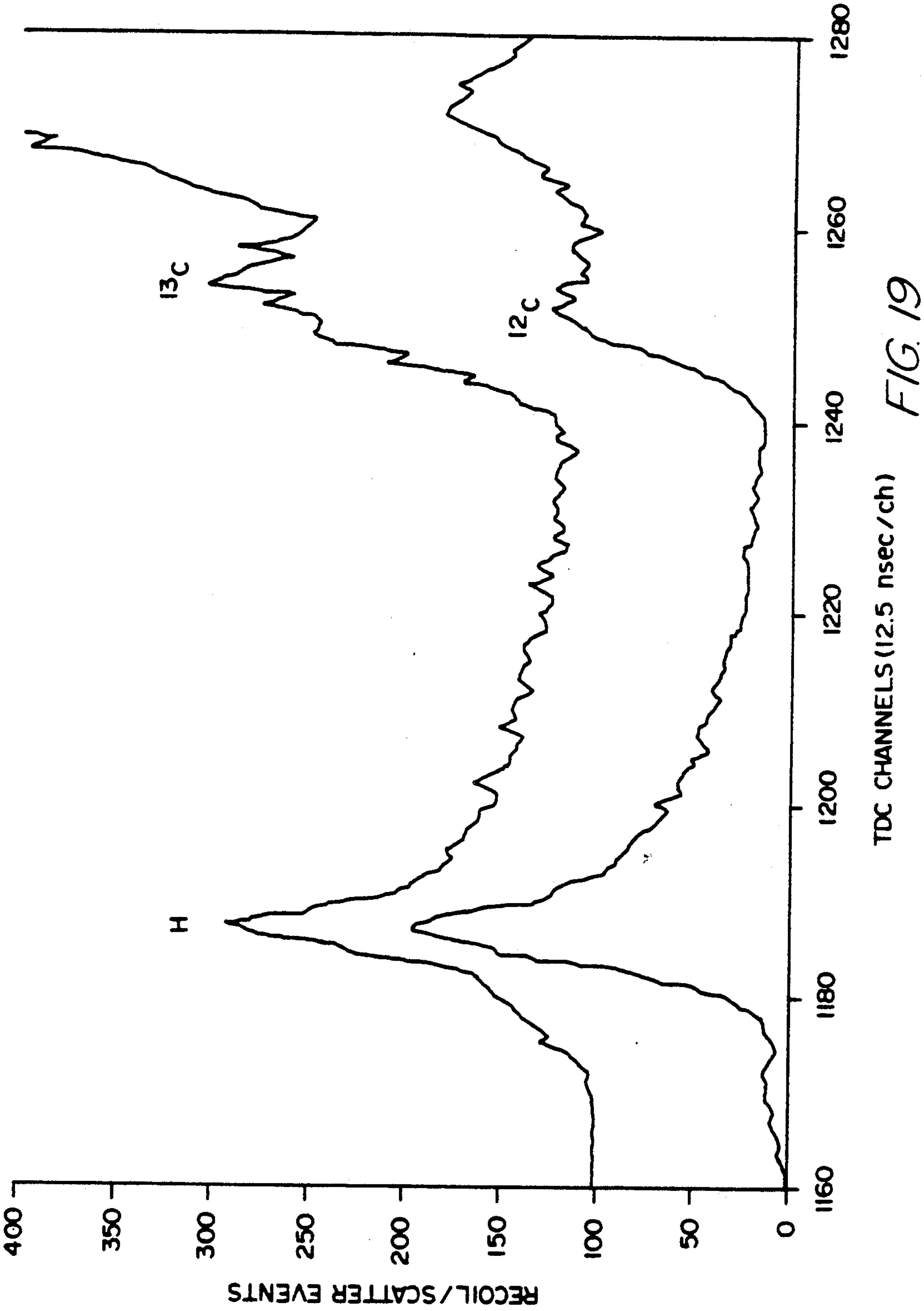
FIG. 19 shows $^{12}C/^{13}C$ turnover during deposition.

Both $^{12}C$ and $^{13}C$ labeled material were deposited under identical conditions in the chemical vapor deposition chamber. Distinguishable DRS spectra were obtained from each. Due to low count rates through this cell real time exchange/turnover kinetics of the process were not attainable. Fairly good statistics are required to reliably distinguish even isotopically pure surfaces because of the small difference in flight times between the carbon isotopes. The rather noisy spectra shown in FIG. 19 were obtained after 30 second depositions using labeled methane. From these, the minimum growth rate was estimated to be one monolayer per 15 seconds, or some 150 angstroms per hour, on the single crystal surface. The actual growth rate determined by SEM from polycrystalline films grown under the same conditions was about 2500 angstroms per hour. One skilled in the art will readily recognize that the chemical vapor deposition chamber can be redesigned to improve beam throughput and permit real time estimates of growth rates.

EXAMPLE XV

Figure 20:
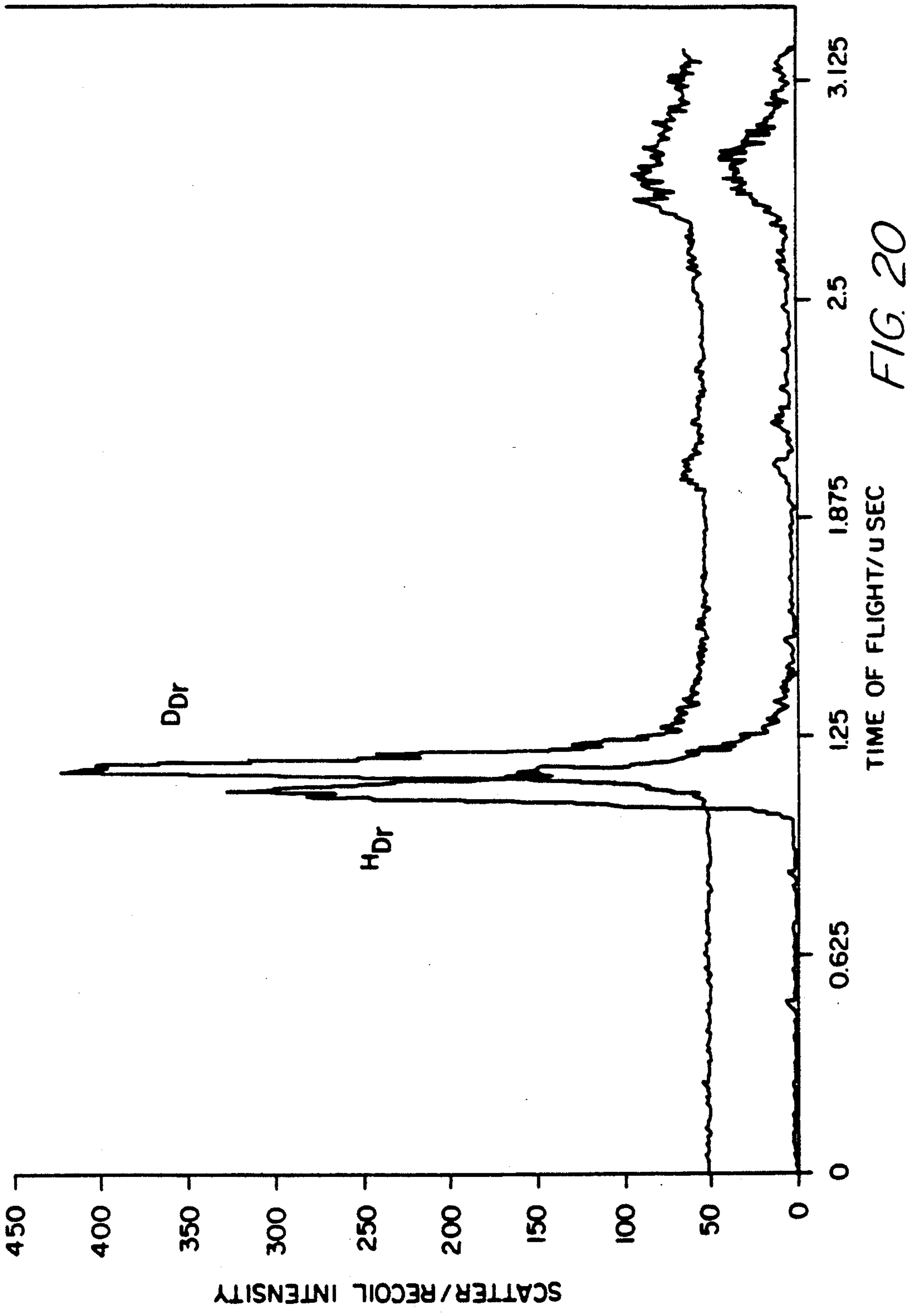
FIG. 20 shows gas phase DRS-hydrogen.
Figure 21:
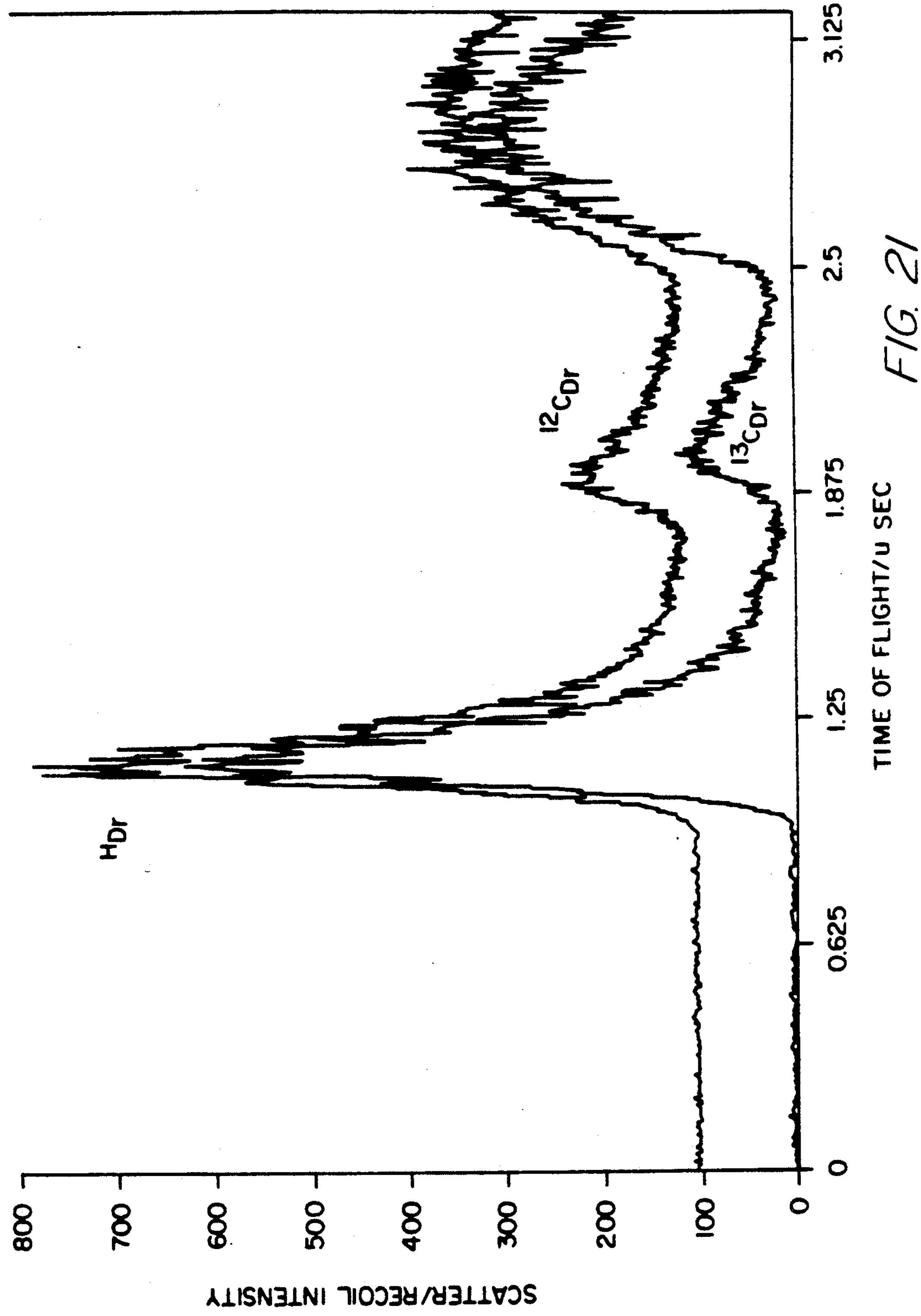
FIG. 21 shows gas phase DRS-methane.
Figure 22:
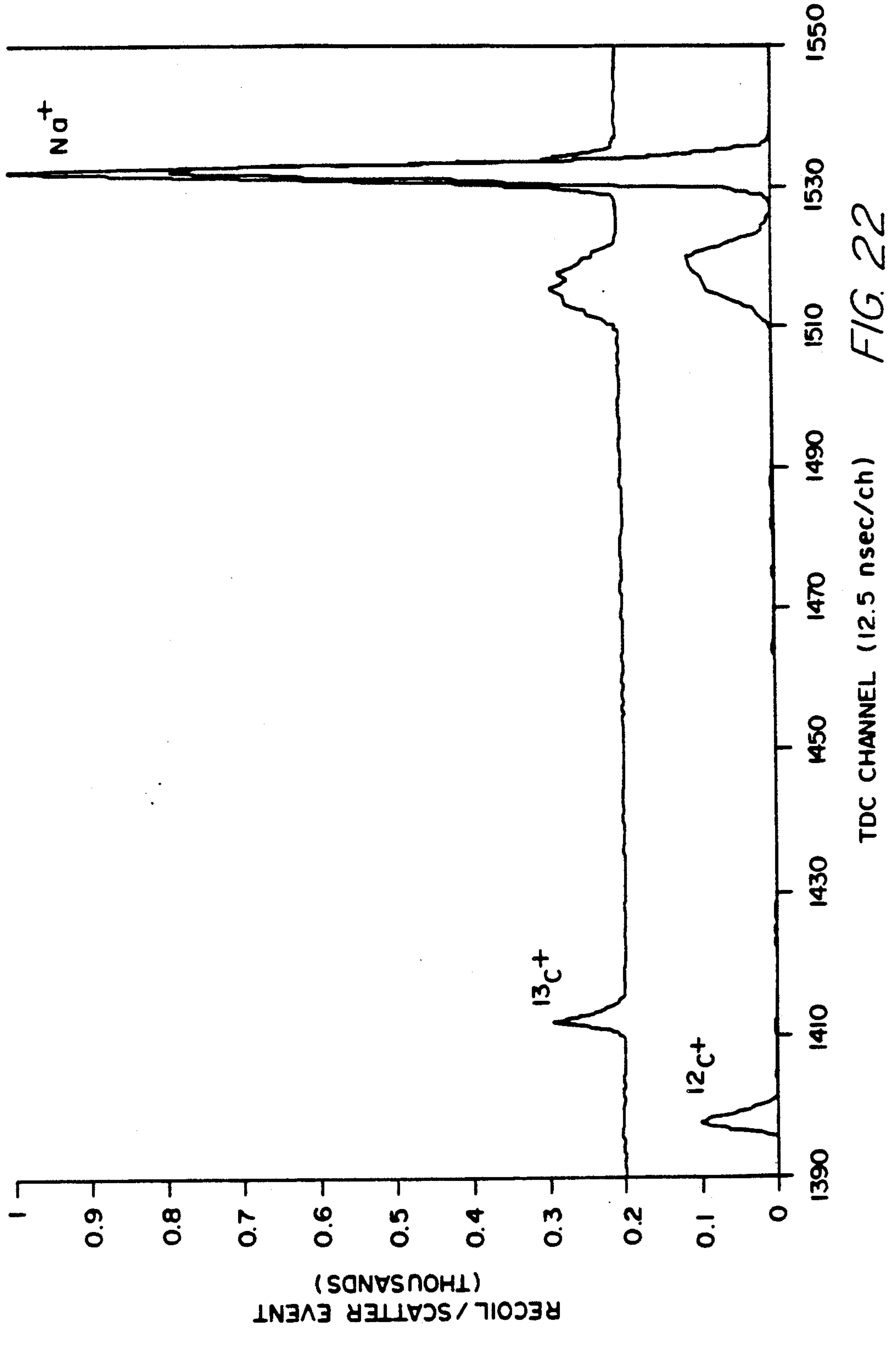
FIG. 22 shows gas phase MSRI.

As previously mentioned, the device of the present invention makes it possible to collect DRS from gas phase species. Standards for quantitative stoichiometric work with DRS have been generated using chemisorbed surface groups on metal targets. By retracting the solid sample in the chemical vapor deposition chamber and filling to about 0.3 Torr with a target gas the device has the capability of collecting DRS from materials of precisely known stoichometry and geometry with rotational averaging Some initial calibration spectra are shown in FIGS. 20 and 21. These include hydrogen and carbon in the form of methane, and their isotopes. The overlapping peaks for the carbon isotopes in methane make it clear why carbon isotope determination on the surface, at least with sodium ion probes, is fairly difficult. As shown in FIG. 22, this Problem can be sidestepped by using the MSRI technique. These spectra were obtained recording the TOF spectra of only the ion population of the directly recoiled signal. These are deflected through an electrostatic energy analyzer before the detector. This removes the multiply scattered signal made up almost entirely of neutral atoms, and reduces the background between the $^{12}C$ and $^{13}C$ to zero. This modification was used successfully to determine isotopic enrichment of 235 isotope in bulk uranium samples. The process is the above discussed Mass Spectrometry of Recoiled Ions (MSRI). MSRI can be performed simultaneously with standard DRS without modification to the chemical vapor deposition chamber, and can readily be implemented in exchange work and in process control of high pressure surface modifications.

It is possible to collect high quality DRS spectra at pressures up to 0.3 Torr without significant data manipulation to subtract gas phase background. Ion scattering data have been obtained at pressures up to several Torr, and with appropriate data manipulation software, useful DRS spectra is also obtained in this Pressure regime. One skilled in the art will recognize that the pressure range can be extended by making smaller diameter chemical vapor deposition chambers, and reducing the high pressure path which must be traversed by the probe ions.

DRS is a relatively new surface probe with submonolayer sensitivity that utilizes a pulsed energetic ion beam to simultaneously detect and resolve light elements, H through F, and their isotopes rapidly and quantitatively by time-of-flight analysis. Like the more common electron based surface spectroscopies (e.g. XPS, AES, UPS, EELS), DRS has previously been used only under Ultra High Vacuum conditions. Unlike electrons, however, energetic ions and atoms are not readily scattered or attenuated by gas molecules. Using existing literature on gas phase ion scattering cross sections, it is estimated that the 3–10 keV $Na^{+}$ion probes typically used in DRS would have a mean free path of at least 1 cm through 1 Torr of hydrogen. Thus, in-situ analysis of the growth of surfaces under low pressure chemical vapor deposition conditions is practical with DRS. Using a small diameter chemical vapor deposition chamber with differentially pumped apertures for incoming ions and outgoing particles, DRS spectra were successfully obtained from diamond surfaces under actual growth conditions. This technique allows the use of a pressure some billion-fold higher than typically used in surface science.

EXAMPLE XVI

Surface hydrogen coverage on diamonds was determined under vacuum and process conditions. These experiments show that the diamond surface is primarily reconstructed during growth, and that there is a dynamic equilibrium between thermal desorption and free radical addition of hydrogen on the surface. Temperature studies under activated process gas further indicate that the rate limiting step in activating the surface for growth is thermal desorption of native hydrogen. The growth surface appears to possess both free radical and alkenic moieties, and may support growth by either methyl radical and acetylenic mechanisms. Thus, the rate limiting step in growth of diamond is the arrival of the appropriate carbon bearing species.

DRS can be used to detect boron, nitrogen, oxygen and fluorine, and to examine the surface chemistry of oxidizing enhancers, as well as incorporation of electrically active dopants. One skilled in the art will readily recognize that the same techniques described herein for the diamond can also be used to study boron nitride growth.

One skilled in the art will readily appreciate that the present invention is well adapted to carry out the objects and obtain the ends and advantages mentioned as well as those inherent therein. The methods, apparatus, assays, procedures and techniques and equipment described herein are presently representative of the preferred embodiments, are intended to be exemplary and not intended as limitations on the scope. Changes therein and other uses will occur to those skilled in the art which are encompassed within the spirit of the invention or defined by the scope of the pending claims.

What is claimed is:

1. A method for isotopic ratio determination of elements on a metallic, semi-conducting or insulating surface, comprising the steps of:

pulsing an ion beam of at least about 2 KeV at grazing incidence to impinge said surface; and detecting the ionized elements directly recoiled from the surface with a high resolution time-of-flight mass spectrometer comprised of at least one linear field free drift tube and at least one toroidal or spherical energy filter with a +/− V polarization to deflect positive or negative ions.

2. The method of claim 1, wherein the surface elements are selected from the group consisting of H, He, Li, Be, B, C, N, 0, F, Ne, Na, Mg, Al, Si, P, S, Cl, Ar, K, Ca, Sc, Ti, V, Cr, Mn, Fe, Co, Ni, Cu, Zn, Ga, Ge, As, Se, Sr, Y, Zr, Nb, Mo, Ru, Rh, Pd, Ag, Cd, In, Sb, Te, Cs, Ba, La, Nd, Gd, Tb, Ta, W, Re, Os, Ir, Pt, Au, Hg, Tl, Pb, Bi, Th and U.

3. The method of claim 1, wherein said ion beam is selected from the group consisting of Cs, Na, Li, B, He, Ar, Ga, In, Kr, Xe, K, Rb, $O_2$, $N_2$ and Ne.

4. The method of claim 1, wherein said ion beam is at least about 15 KeV.

5. The method of claim 4, wherein said ion beam is Cs.

6. The method of claim 1, wherein said surface is coated with an overlayer.

7. The method of claim 6, wherein said overlayer is selected from the group consisting of hydrocarbons, carbon, gold, platinum, aluminum, oxides, frozen noble gases and molecular gases.

8. A method for determining elements on a surface with high pressure mass spectrometry, comprising the steps of:

pulsing an ion beam of at least about 2 KeV at grazing incidence of between 45° and 80° to impinge said surface; and detecting the direct recoiled ions of element with a mass spectrometer having a time-of-flight sector comprising at least one linear field free drift tube and at least one toroidal or spherical energy filter with a +/− v polarization to deflect positive or negative ions; located at an elevation angle of about 0° to 85° and a channelplate detector for measurement of direct recoiled ions.

9. The method of claim 8, wherein said angle is 35°.

10. The method of claim 9, wherein said element measured is selected from the group consisting of H, He, Li, Be, B, C, N, 0, F, Ne, Na, Mg, Al, Si, P, S, Cl, Ar, K, Ca, Sc, Ti, V, Cr, Mn, Fe, Co, Ni, Cu, Zn, Ga, Ge, As, Se, Sr, Y, Zr, Nb, Mo, Ru, Rh, Pd, Ag, Cd, In, Sb, Te, Cs, Ba, La, Nd, Gd, Tb, Ta, W, Re, Os, Ir, Pt, Au, Hg, Tl, Pb, Bi, Th and U.

11. The method of claim 8, wherein said pulsed ion beam is selected from the group consisting of Cs, Na, Li, B, He, Ar, Ga, In, Kr, Xe, K, Rb, $O_2$, $N_2$ and Ne.

12. The method of claim 8, wherein said pulsed ion beam is at least about 15 KeV.

13. The method of claim 12, wherein said ion beam is Cs.

14. The method of claim 8, wherein the pressure is from about $10^{-11}$ Torr to 1 Torr.

15. A method for quantitive measurement of elements on a surface with a high pressure mass spectrometer comprising the steps of:

pulsing an ion beam of at least about 2 KeV at grazing incidence to impinge the surface;

detecting positive or negative ions of elements recoiled from the surface with a first high resolution time-of-flight mass analyzer comprised of at least one linear field free drift tube and at least one toroidal or spherical energy filter with a +/− V polarization on the sectors of the filter to deflect positive or negative ions, wherein the outer sector of said filter contains a hole;

detecting direct recoiled ions and neutrals with a second mass analyzer attached to the first mass analyzer and positioned to detect ions and neutrals exiting through said hole, wherein said second mass analyzer has a time-of-flight detector located at an elevation angle of 0° to 85°, an electrostatic deflection plate to separate negative and positive ions and neutrals, and a channelplate detector with at least three anodes, said anodes detecting either direct recoiled negative or positive ions or neutrals;

alternately collecting data on the first and second mass analyzers at time intervals ranging from 100 μsec to 1 sec; and comparing the ion intensity from the first high resolution analyzer to the intensity of the neutrals and ions detected in the second analyzer used to obtain the ion fraction of the recoiled element.

16. The method of claim 15, wherein the elements are selected from the group consisting of H, He, Li, Be, B, C, N, 0, F, Ne, Na, Mg, Al, Si, P, S, Cl, Ar, K, Ca, Sc, Ti, V, Cr, Mn, Fe, Co, Ni, Cu, Zn, Ga, Ge, As, Se, Sr, Y, Zr, Nb, Mo, Ru, Rh, Pd, Ag, Cd, In, Sb, Te, Cs, Ba, La, Nd, Gd, Tb, Ta, W, Re, Os, Ir, Pt, Au, Hg, Tl, Pb, Bi, Th and U.

17. The method of claim 15, wherein the angle is 35°.

18. The method of claim 15, wherein the pressure is $10^{-11}$ Torr to 1 Torr.

19. The method of claim 15, wherein said surface is coated with an overlayer.

20. The method of claim 19 wherein the overlayer is selected from the group consisting of hydrocarbons, carbon, gold, platinum, aluminum, oxides, frozen noble gases and molecular gases.

21. An apparatus for measuring recoiled and direct recoiled ions comprising:

a sample chamber;

an ion beam pulsing means for generating a pulsed ion beam, said pulsing means oriented at an angle to the sample chamber, wherein the pulsing ion beam impinges a surface of a sample in the sample chamber at a grazing incidence of about 45° to 80°;

a first mass analyzer attached to the sample chamber at an elevation angle of about 0° to 85° relative to the sample and in the forward specular direction, said first mass analyzer having at least one field free drift tube and at least one toroidal or spherical energy filter with sector halves polarizable +/− V for the deflection of positive or negative ions and, wherein the outer sector of said filter includes a hole;

a second mass analyzer for detecting direct recoiled ions and neutrals when the sectors of the first analyzer are grounded, said second analyzer having an electrostatic deflector and an ion detector containing three separate anodes, said ion detector attached to at least one field free drift tube of said first mass analyzer in a position to simultaneously detect ions and neutrals separated by the electrostatic detector, after said ions and neutrals exit through the hole in the outer sector of the first mass analyzer; and a computer system for regulating the frequency of pulsing and the collection of data from the first and second mass analyzers.

22. The apparatus of claim 21, comprising further at least one pulse sequencer attached to the first mass analyzer within at least one linear field free flight path.

23. The apparatus of claim 21, wherein the ion pulsing means includes at least about a 15 KeV alkali ion source, at least one adjustable slit attached between the ion source and the sample chamber for directing and focusing the ion beam emitted from the ion source and at least one pulser and lens attached between the ion source and sample chamber for generating a pulsed ion beam.

24. The method of claim 23, wherein said ion beam is selected from the group consisting of Cs, Na, Li, B, He, Ar, Ga, In, Kr, Xe, K, Rb, $O_2$, $N_2$ and Ne.

25. The apparatus of claim 23, further comprising a focusing lens to vary the divergence between 0.5° to 3°, said lens attached between the pulser and the sample.

26. The apparatus of claim 21, wherein said second mass analyzer is at a scattering angle of 35°.

27. The apparatus of claim 21, further comprising a third mass analyzer for ion scattering spectroscopy said third mass analyzer having a time-of-flight tube with at least one channelplate detector attached to said sample chamber at a scattering angle of about 45° to 180°.

28. The apparatus of claim 27, wherein said channelplate detector is at an angle of 78°.

29. The apparatus of claim 21, further comprising:

a second ion beam; and at least one channelplate ring detector for detecting backscatter ions said channelplate ring detector positioned between the second ion beam source and sector containing a hole in the outer sector half and the sample, wherein direction of incidence of ion beam on the sample is normal to the midpoint of the diameter of said at least one anode ring of said channelplate ring.

30. The apparatus of claim 29 wherein said channelplate detector includes 10 concentric annuli rings, wherein each annular ring is ½ degree wide and said annular rings are positioned on a channelplate to detect 10 backscattering spectra covering an angle of about 165° to 180°.

31. An apparatus of claim 21 further comprising:

A fourth mass analyzer for detecting secondary ions at an angle of about +/− relative to the sample normal, said fourth mass analyzer having provisions for biasing the sample or analyzer to extract secondary ions and having at least one field free drift tube and at least one toroidal or spherical energy filter with sector halves polarizable +/− V for deflection of positive or negative ions, wherein the outer sector of said filter includes a hole; and A fifth mass analyzer for detecting scattered ions and neutrals, said fifth mass analyzer having an ion detector attached to at least one field free drift tube of the fourth mass analyzer in a position to detect ions and neutrals, exiting through the hole in the outer sector of the fourth mass analyzer.

32. The apparatus of claim 31, further comprising of at least one pulse sequencer attached to the fourth mass analyzer within at least one linear field free flight path.

33. An apparatus for ion scattering spectroscopy and secondary ion mass spectrometry comprising:

a sample chamber;

an ion beam pulsing means for generating a pulsed ion beam, said pulsing means oriented at an angle to the sample chamber, wherein the pulsing ion beam impinges a surface of a sample in the sample chamber at a grazing incidence of about 45° to 80°;

a first mass analyzer for secondary ion mass spectrometry attached to the sample chamber at an angle of about 80° to 180° relative to the sample, said first mass analyzer having at least one toroidal or spherical field free drift tube and at least one toroidal or spherical energy filter with sector halves polarizable +/− V for the deflection of positive or negative ions, and wherein the outer sector of said filter includes a hole;

a second mass analyzer for ion scattering spectroscopy, said second mass analyzer attached to at least one field free drift tube of said first mass analyzer in a position to detect ions and neutrals, exiting through the hole in the outer sector of the first analyzer; and a computer system for regulating the frequency of ion pulsing and the collection of data from the first and second mass analyzers.

34. The apparatus of claim 33, further comprising at least one pulse sequencer attached to the first mass analyzer within at least one linear field free flight path.

35. A device for high pressure real time stoichiometry measurements of a surface comprising:

a sample chamber;

an ion beam pulsing means oriented at an angle to the sample chamber generating a pulsed ion beam at a grazing incidence to impinge the surface of a sample in the sample chamber;

a micro capillary gas doser to form a local area of high pressure on the surface;

a first array of discrete detectors in the forward specular hemisphere to measure forward ion scatter from the ion beam impinging the surface, said first array including up to about 100 discrete detectors each defining a scattering angle of ±0.5°;

a second array of discrete detectors in the back specular hemisphere to measure the backward ion scatter from the ion beam impinging the surface, said second array including up to about 100 discrete detectors each defining a scattering angle of ±0.5°; and a collection means to collect a multiplicity of time of flight data simultaneously from each detector in both the first and second array of discrete detectors.

36. The device of claim 35, wherein the primary angle of grazing incidence of the pulsed ion beam is about 45° to 85°; the angle of forward ion scatter is about 0° to 90°; and the backward ion scatter is 90° to 180°.

37. The device of claim 35, wherein the gas doser is of sufficient size to expose about a 100 μdiameter of the surface to a local pressure of up to about 100 Torr.

38. The device of claim 35 for determining the real time stoichiometry during high pressure surface modification, wherein the gas doser of claim 35 is replaced with a device for depositing thin films selected from the group consisting of elemental effusion source, molecular beam source, chemical beam source, sputter deposition source, laser ablation source, plasma assisted chemical vapor deposition source and atomic layer epitaxy source.

39. The device of claim 35 for determining the real time stoichiometry during high pressure modification, wherein the gas doses of claim 35 is replaced with an etching device selected from the group consisting of chemical beam source, ion sputtering source, plasma sputtering source, and laser ablation source.

40. The apparatus of claim 35 determining real time stoichiometry during the annealing process, further comprising a heating element in the sample chamber.

41. A device for performing DRS in a differentially pumped chamber comprising:

a sample chamber, said chamber containing a first jacket with an entrance slit to allow access to the chamber by an ion beam and an exit slit to allow egress of the recoil or scattered ions, said slits further allow the sample chamber to maintain a pressure of 1 Torr; and a second jacket with entrance and exit slits similar to said slits in first jacket and, a pump to remove gas from the sample chamber and maintain differential pressure between the sample chamber and an ion beam and a detector chambers wherein said ion beam and detector chambers are less than $10^{-5}$ Torr.

42. A method of measuring elemental surface concentrations in real time comprising the steps of:

impinging about a 100 μdiameter of a surface with a device for high pressure real time stoichiometry measurements, said device comprising a sample chamber, an ion beam pulsing means oriented at an angle to the sample chamber and generating a pulsed ion beam at a grazing incidence to impinge the surface of a sample in the sample chamber and a microcapillary gas doser to form a local area of high pressure on the surface;

detecting the forward direct recoiled ion and neutral profile from the impinging step with a first array of discrete detectors in the forward specular hemisphere from the ion beam impinging surface, said first array including up to about 100 discrete detectors, each defining a scattering angle of ±0.50;

detecting the low energy ion scattering from the surface with said first array of discrete detectors and with a second array of discrete detectors in the back specular hemisphere, said second array including up to about 100 discrete detectors, each defining in a scattering angle of ±0.50;

sampling the ion scatter at the rate of about every 10 μsec. to 1 sec. with a collection means that collects a multiplicity of time of flight data simultaneously from each detector in both the first and second array of discrete detectors; and analyzing the data selected from the group of direct recoil scattering, low energy ion scattering and a combination thereof.

43. The method of claim 42 for analyzing the real time stoichiometry during deposition of elements on the surface wherein the gas doser of the impinging step is replaced with a device for depositing thin films selected from the group consisting of elemental effusion source, molecular beam source, chemical beam source, sputter deposition source, laser ablation source, plasma assisted chemical vapor deposition source and atomic layer epitaxy source.

44. The method of claim 42 for analyzing the real time stoichiometry during etching of elements on the surface, wherein the gas doser of the impinging step is replaced with an etching device selected from the group consisting of chemical beam source, ion sputtering source, plasma sputtering source, and laser ablation source.

45. The method of claims 43 or 44 for the process control of surface modification, wherein the analysis is in real time stoichiometry during deposition or etching of elements on the surface and further comprising the step of:

regulating the intensity of a plurality of deposition or etching sources by adjusting the intensity based on the real time stoichiometry sampling.

46. A method of determining the crystallography by blocking and shadowing analysis with a device for high pressure time stoichiometry measurements comprising the steps of:

impinging a surface of a sample with said device, wherein said device comprises a sample chamber, an ion beam pulsing means oriented at an angle to the sample chamber and generating a pulsed ion beam at a grazing incidence to the surface of a sample in the sample chamber and a microcapillary gas doser to form a local area of high pressure on the surface;

detecting the forward direct recoil ion and neutral profile from the impinging step with a first array of discrete detectors in the forward specular hemisphere, said first array including up to about 100 discrete detectors each defining a scattering angle of ±0.50;

detecting the low energy ion scattering from said surface with a second array of discrete detectors in the back specular hemisphere, said second array including up to about 100 discrete detectors each defining a scattering angle of ±0.50;

collecting the time of flight data simultaneously from each detector in both the first and second array of discrete detectors; and monitoring the ion beam scattering intensity as a function of scattering angle.

47. A method for calibrating a DRS or MSRI intensity comprising the steps of:

inserting into a sample chamber a gas of known composition;

pulsing an ion beam of at least about 2 KeV into said gas; and detecting the resultant ionized recoiled atoms of the gas.

* * * * *

UNITED STATES PATENT OFFICE
CERTIFICATE OF CORRECTION

Patent No. 5,087,815 Dated February 11, 1992

Inventor(s) J. Albert Schultz and Howard K. Schmidt

It is certified that error appears in the above-identified patent and that said Letters Patent is hereby corrected as shown below:

Column 2, line 45, after "compromised" change "b" to -- by --

Column 4, line 46, before "deflection" change "el" to -- electrostatic --

Column 6, line 18, before "data" change "time of flight" to -- time-of-flight --

Column 9, line 35 and 36, after "to" change "Primary" --primary--.

Column 11, line 53-54, after "ion pump" delete "and the reaction chamber 12 is pumped by a mechanical pump"

Column 11, line 54, before "168" delete "mechanical pump"

Column 12, line 48 and 49, after "V" change "Polarization" to --polarization--.

Column 12, line 62, before "detected" add -- neutrals and ions --

UNITED STATES PATENT OFFICE

CERTIFICATE OF CORRECTION

Patent No. 5,087,815 Dated February 11, 1992

Inventor(s) J. Albert Schultz and Howard K. Schmidt

It is certified that error appears in the above-identified patent and that said Letters Patent is hereby corrected as shown below:

Column 16, line 47, after "is" delete paragraph and change to -- is another unique area --

Column 18, line 16, before "unity" change "nearly" to -- near --

Column 18, line 30, before "can" change "IT" to -- It --

Column 18, line 39, before "sector" change "TOFR/SIMS" to -- TOF/SIMS --

Column 20, line 36, add as a new paragraph -- In Table 3, the velocities of naturally occurring interferences are shown. --

Column 22, line 52, before "relative" change "the" to -- The --

Column 25, line 12, change "averaging Some" to -- averaging. Some --

Column 25, line 18, after "this" change "Problem to -- problem --

Column 25, line 40, after "this" change "Pressure" to -- pressure --

Column 26, line 50, after "N," change "0" to -- O --

Column 27, line 7, before "with" change "element" to -- elements --

Column 27, line 18, after "N," change "0" to -- O --

UNITED STATES PATENT AND TRADEMARK OFFICE

CERTIFICATE OF CORRECTION

PATENT NO. : 5,087,815 Page 3 of 3

DATED : February 11, 1992

INVENTOR(S) : J. Albert Schultz, et al.

It is certified that error appears in the above-indentified patent and that said Letters Patent is hereby corrected as shown below:

Column 27, line 64, after "N", change "0" to --O--.

Signed and Sealed this

Seventh Day of September, 1993

Attest:

BRUCE LEHMAN

*Attesting Officer* *Commissioner of Patents and Trademarks*

UNITED STATES PATENT AND TRADEMARK OFFICE
CERTIFICATE OF CORRECTION

PATENT NO. : 5,087,815

DATED : February 11, 1992

INVENTOR(S) : J. Albert Schultz and Howard K. Schmidt

It is certified that error appears in the above-identified patent and that said Letters Patent is hereby corrected as shown below:

Column 2, line 45, after "compromised" change "b" to --by--.

Column 4, line 46, before "deflection" change "el" to --electrostatic--.

Column 6, line 18, before "data" change "time of flight" to --time-of-flight--.

Column 9, line 35 and 36, after "to" change "Primary" --primary--.

Column 9, line 63, after "deflected" delete --.--, and line 64, starting with "to the left by" should be part of previous paragraph.

Column 10, line 6, after "be" change Purged" to --purged--.

Column 10, line 34, change "Proportional" to --proportional--.

Column 10, line 53, change "$TOF \rightarrow Tp+K(M_R/e)^{1/2}$" to --$TOF=Tp+K(M_R/e)^{1/2}$--.

Column 12, line 48 and 49, after "V" change "Polarization" to --polarization--.

Column 12, line 62, before "detected" add --neutrals and ions--.

Column 16, line 47, after "is" delete paragraph and change to --is another unique area--.

Column 18, line 16, before "unity" change "nearly" to --near--.

Column 18, line 30, before "can" change IT" to --It--.

Column 18, line 39, before "sector" change "TORF/SIMS" to --TOF/SIMS--.

Column 20, line 36, add as a new paragraph --In Table 3, the velocities of naturally occurring interferences are shown--.

Column 22, line 52, before "relative" change "the" to --The--.

Column 25, line 13, change "averaging Some" to --averaging. Some--.

Column 25, line 18, after "this" change "Problem to --problem--.

Column 25, line 40, after "this" change Pressure" to --pressure--.

Column 26, line 50, after "N," change "0" to --O--.

UNITED STATES PATENT AND TRADEMARK OFFICE
CERTIFICATE OF CORRECTION

PATENT NO. : 5,087,815

DATED : February 11, 1992

INVENTOR(S) : J. Albert Schultz and Howard K. Schmidt

It is certified that error appears in the above-identified patent and that said Letters Patent is hereby corrected as shown below:

Column 27, line 7, before "with" change "element" to --element--.

Column 27, line 18, after "N," change "0" to --0--.

Column 27, line 64, after "N," change "0" to --0--.

This certificate supersedes the Certificate of Correction issued September 7, 1993.

Signed and Sealed this

Second Day of November, 1993

Attest:

BRUCE LEHMAN

Attesting Officer

Commissioner of Patents and Trademarks